United States Patent
Lin et al.

(10) Patent No.: US 12,327,519 B2
(45) Date of Patent: Jun. 10, 2025

(54) ELECTRONIC DEVICES WITH DISPLAYS FOR MITIGATING CATHODE NOISE

(71) Applicant: Apple Inc., Cupertino, CA (US)

(72) Inventors: Chin-Wei Lin, San Jose, CA (US); Aida R Colon-Berrios, Cupertino, CA (US); Fan Gui, Sunnyvale, CA (US); Levent Erdal Aygun, Cupertino, CA (US); Mohammad Reza Esmaeili Rad, San Jose, CA (US); Ran Tu, San Jose, CA (US); Xin Lin, Santa Clara, CA (US); Yun Wang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/859,835

(22) Filed: Jul. 7, 2022

(65) Prior Publication Data

US 2023/0081342 A1    Mar. 16, 2023

Related U.S. Application Data

(60) Provisional application No. 63/244,045, filed on Sep. 14, 2021.

(51) Int. Cl.
*G09G 3/3233* (2016.01)
*H10K 59/121* (2023.01)
(Continued)

(52) U.S. Cl.
CPC ....... *G09G 3/3233* (2013.01); *H10K 59/1213* (2023.02); *H10K 59/1216* (2023.02);
(Continued)

(58) Field of Classification Search
CPC ......... G09G 3/3233; G09G 2320/0233; G09G 2300/0819; G09G 2320/041;
(Continued)

(56) References Cited

U.S. PATENT DOCUMENTS 5,625,360 A * 4/1997 Garrity ............... H03M 1/0863
341/144
8,564,507 B2  10/2013 Jang et al.
(Continued)

FOREIGN PATENT DOCUMENTS

CN   111276096 A   6/2020
JP   2008287140 A  11/2008
(Continued)

*Primary Examiner* — Shaheda A Abdin
(74) *Attorney, Agent, or Firm* — Treyz Law Group; Jason Tsai

(57) ABSTRACT

A display may include an array of pixels. Each pixel in the array may include a drive transistor, emission transistors, a data loading transistor, a gate voltage setting transistor, an initialization transistor, an anode reset transistor, a storage capacitor, and an optional current boosting capacitor coupled in series with an isolation transistor. A data refresh may include a initialization phase, a threshold voltage sampling phase, and a data programming phase. The threshold voltage sampling phase can be substantially longer than the data programming phase to decrease a current sampling level during the threshold voltage sampling phase, which helps reduce the display luminance sensitivity to temperature variations. During a data refresh, the isolation transistor can be turned on to provide current boosting. During emission periods, the isolation transistor is turned off to prevent cathode noise from potentially coupling through to one or more direct-current voltage nodes in the pixel.

23 Claims, 17 Drawing Sheets

(51) Int. Cl.
*H10K 59/126* (2023.01)
*H10K 59/131* (2023.01)
*H10D 30/67* (2025.01)
*H10D 86/40* (2025.01)
*H10D 86/60* (2025.01)

(52) U.S. Cl.
CPC ......... *H10K 59/126* (2023.02); *H10K 59/131* (2023.02); *G09G 2300/0819* (2013.01); *G09G 2300/0842* (2013.01); *G09G 2300/0861* (2013.01); *G09G 2310/08* (2013.01); *G09G 2320/0233* (2013.01); *G09G 2320/041* (2013.01); *H10D 30/6731* (2025.01); *H10D 30/6745* (2025.01); *H10D 30/6755* (2025.01); *H10D 86/423* (2025.01); *H10D 86/441* (2025.01); *H10D 86/471* (2025.01); *H10D 86/481* (2025.01); *H10D 86/60* (2025.01)

(58) Field of Classification Search
CPC ... G09G 2300/0861; G09G 2300/0842; G09G 2310/08; H10K 59/126; H10K 59/131; H10K 59/1213; H10K 59/1216; H01L 29/7869; H01L 27/1251; H01L 29/78675; H01L 27/1225; H01L 27/1255
See application file for complete search history.

(56) References Cited

U.S. PATENT DOCUMENTS

| | | | |
|---|---|---|---|
| 8,593,445 B2 | 11/2013 | Yamamoto et al. | |
| 9,153,169 B2 | 10/2015 | Yamashita et al. | |
| 9,412,799 B2 | 8/2016 | Chang et al. | |
| 10,134,348 B2 | 11/2018 | Cote et al. | |
| 10,170,049 B2 | 1/2019 | Ryu et al. | |
| 10,783,830 B1 * | 9/2020 | Lu | G09G 3/3258 |
| 10,902,778 B2 | 1/2021 | Kim et al. | |
| 2005/0180083 A1 | 8/2005 | Takahara et al. | |
| 2007/0080905 A1 | 4/2007 | Takahara | |
| 2008/0030595 A1 * | 2/2008 | Murakami | H04N 25/76 348/222.1 |
| 2010/0194716 A1 * | 8/2010 | Park | G09G 3/3233 345/204 |
| 2013/0140538 A1 * | 6/2013 | Fujita | H10K 59/00 257/40 |
| 2014/0064512 A1 * | 3/2014 | Yu | H01R 24/58 381/74 |
| 2014/0184665 A1 | 7/2014 | Yoon et al. | |
| 2014/0327664 A1 | 11/2014 | Kanda et al. | |
| 2015/0171156 A1 * | 6/2015 | Miyake | H01L 29/7869 257/43 |
| 2016/0379552 A1 | 12/2016 | Kim et al. | |
| 2017/0148388 A1 | 5/2017 | Gai et al. | |
| 2018/0032176 A1 * | 2/2018 | Krah | G06F 3/0418 |
| 2018/0108295 A1 | 4/2018 | Ebisuno | |
| 2018/0190194 A1 | 7/2018 | Zhu et al. | |
| 2019/0019452 A1 * | 1/2019 | Zhu | G09G 3/3266 |
| 2019/0180688 A1 | 6/2019 | Yang et al. | |
| 2020/0076411 A1 * | 3/2020 | Lee | H03K 3/356017 |
| 2020/0135106 A1 * | 4/2020 | Lu | H01L 27/1255 |
| 2020/0226978 A1 | 7/2020 | Lin et al. | |
| 2020/0320930 A1 * | 10/2020 | Toyotaka | G09F 9/30 |
| 2020/0343276 A1 | 10/2020 | Sakata et al. | |
| 2021/0193049 A1 * | 6/2021 | Lin | G09G 3/3266 |
| 2021/0312864 A1 * | 10/2021 | Zheng | G09G 3/3233 |
| 2021/0351260 A1 | 11/2021 | Kim | |

FOREIGN PATENT DOCUMENTS

| | | |
|---|---|---|
| JP | 2018141955 A | 9/2018 |
| JP | 2021510207 A | 4/2021 |

* cited by examiner

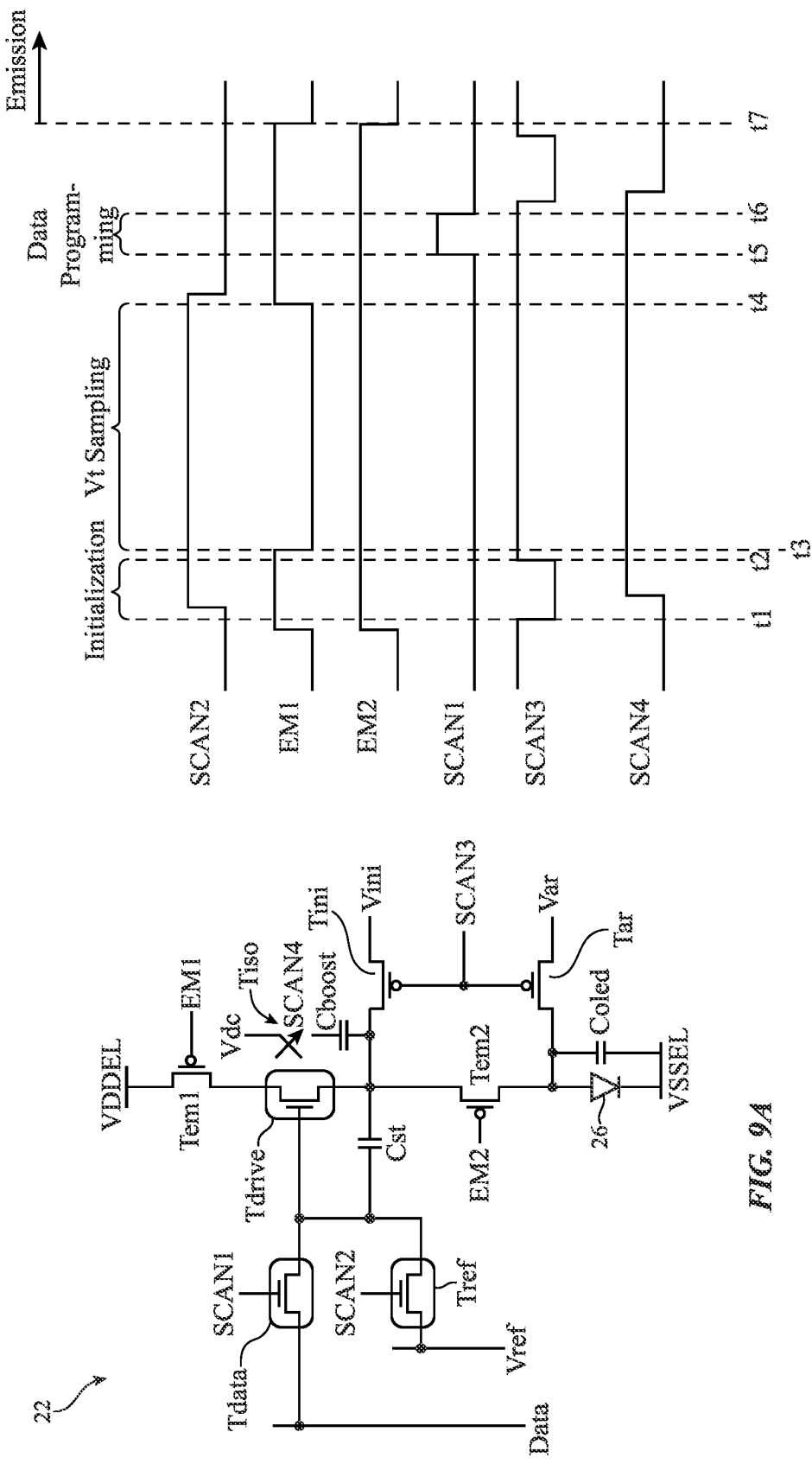

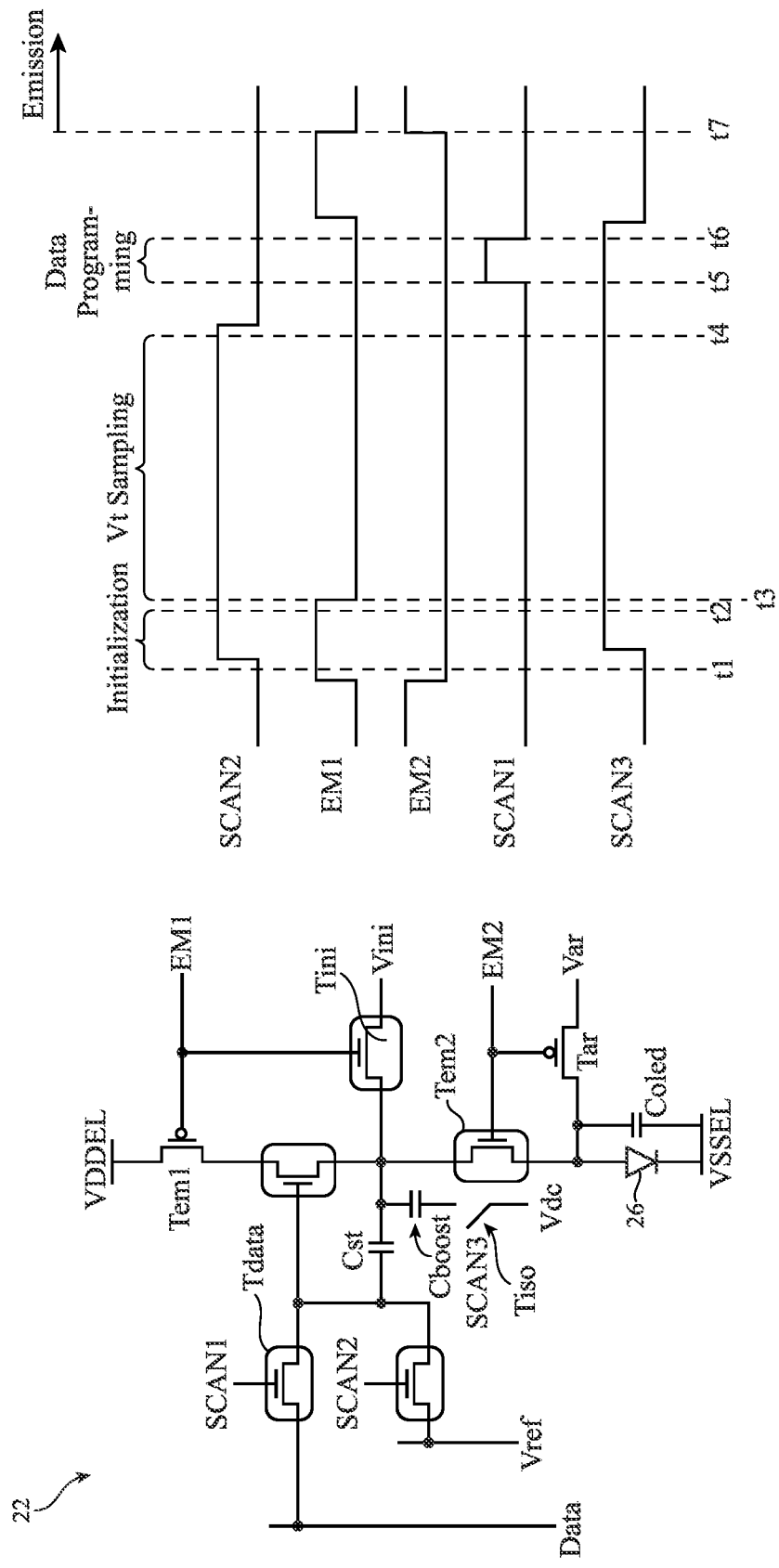

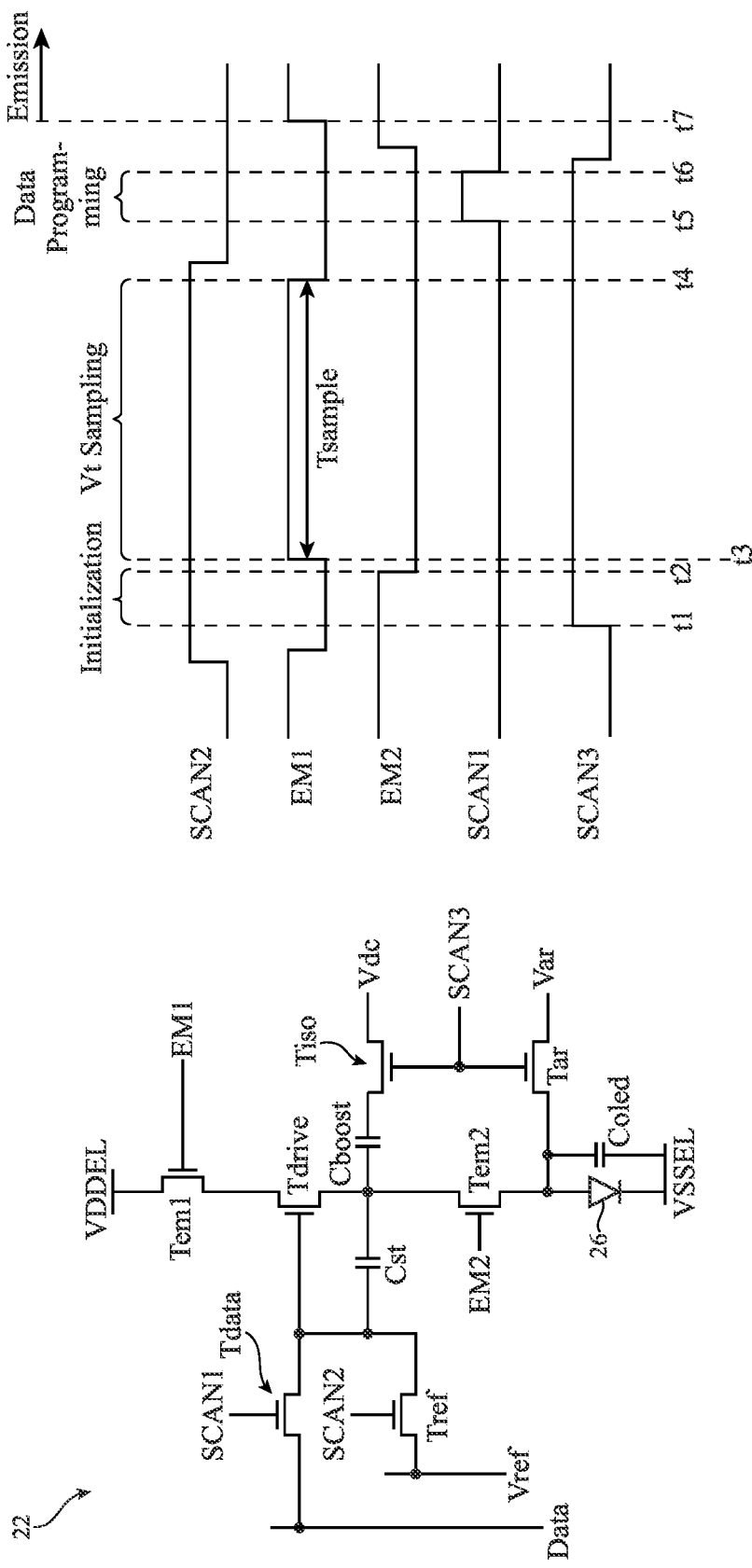

ELECTRONIC DEVICES WITH DISPLAYS FOR MITIGATING CATHODE NOISE

This application claims the benefit of U.S. Provisional Patent Application No. 63/244,045, filed Sep. 14, 2021, which is hereby incorporated by reference herein in its entirety.

BACKGROUND

This relates generally to electronic devices with displays and, more particularly, to displays such as organic light-emitting diode (OLED) displays.

Electronic devices often include displays. For example, cellular telephones and portable computers typically include displays for presenting image content to users. OLED displays have an array of display pixels based on light-emitting diodes. In this type of display, each display pixel includes a light-emitting diode and associated thin-film transistors for controlling application of data signals to the light-emitting diode to produce light. It can be challenging to design a satisfactory OLED display for an electronic device.

SUMMARY

An electronic device may include a display having an array of display pixels. The display pixels may be organic light-emitting diode display pixels. Each display pixel may include at least an organic light-emitting diode (OLED) that emits light and associated thin-film transistors for controlling the operation of the pixel to help reduce temperature luminance sensitivity for the display.

A display pixel may include a drive transistor for driving a current through a light-emitting diode, a first emission transistor coupled in series with the drive transistor, a second emission transistor coupled in series with the drive transistor, a storage capacitor coupled across the gate and source terminals of the drive transistor, a data loading transistor coupled to the gate terminal of the drive transistor, a gate voltage setting transistor coupled to the gate terminal of the drive transistor, an anode reset transistor directly coupled to the anode of the light-emitting diode, and a current boosting capacitor coupled between the source terminal of the drive transistor and a static voltage source. An isolation transistor can be coupled in series with the current boosting capacitor and can be turned off during emission periods to prevent any potential noise on the cathode of the light-emitting diode from coupling onto the static voltage source.

The data loading transistor can be coupled to a data line and can be controlled by a first scan signal. The gate voltage setting transistor can be coupled to a reference voltage line and can be controlled by a second scan signal. The anode reset transistor can be coupled to an anode reset voltage. The isolation transistor can be controlled by yet another scan signal. The drive transistor, the data loading transistor, and the gate voltage setting transistor can be semiconducting oxide transistors. The first emission transistor and the anode reset transistor can have opposite channel-types and be controlled by the same control signal. The order of the drive transistor and the first emission transistor can be interchanged. The pixel may further include an initialization transistor coupled to the source terminal of the drive transistor. The anode reset transistor and the initialization transistor may be controlled by the same scan signal. In another example, the initialization transistor may be controlled by a first emission control signal whereas the anode reset transistor may be controlled by a second emission control signal. If desired, the current boosting capacitor may be excluded from the pixel.

To perform data refresh, the display pixel may undergo at least an initialization phase, a threshold voltage sampling phase, and a data programming phase. During the initialization phase, the gate voltage setting transistor applies a reference voltage to the gate terminal of the drive transistor while the anode reset transistor resets the anode and the source terminal of the drive transistor to the anode reset voltage level. If an initialization transistor is coupled to the source terminal of the drive transistor, the source terminal of the drive transistor can be solely reset to the initialization voltage level. At the end of the threshold voltage sampling phase, the storage capacitor is biased such that the voltage across the storage capacitor is proportional to the threshold voltage of the drive transistor. During the data programming phase, the data loading transistor is activated to load a data signal onto the storage capacitor without losing threshold voltage information sampled in the previous threshold voltage sampling phase. The isolation transistor may be activated during data refresh but may be deactivated prior to emission. The corresponding drive current generated during emission should be independent of any threshold voltage variation at the drive transistor. The threshold voltage sampling phase may be substantially longer than the data programming phase to reduce the display's sensitivity to temperature variations.

BRIEF DESCRIPTION OF THE DRAWINGS

FIG. 9A is a circuit diagram showing another implementation of an illustrative display pixel operable to perform an extended threshold voltage sampling phase separately from a data programming phase in accordance with some embodiments.

FIG. 9B is a timing diagram illustrating the behavior of relevant control waveforms during a refresh operation of the pixel shown in FIG. 9A in accordance with some embodiments.

FIG. 12A is a circuit diagram showing another implementation of an illustrative display pixel operable to perform an extended threshold voltage sampling phase separately from a data programming phase in accordance with some embodiments.

FIG. 12B is a timing diagram illustrating the behavior of relevant control waveforms during a refresh operation of the pixel shown in FIG. 12A in accordance with some embodiments.

FIG. 16A is a circuit diagram showing another implementation of an illustrative display pixel operable to perform an extended threshold voltage sampling phase separately from a data programming phase in accordance with some embodiments.

FIG. 16B is a timing diagram illustrating the behavior of relevant control waveforms during a refresh operation of the pixel shown in FIG. 16A in accordance with some embodiments.

DETAILED DESCRIPTION

Figure 1:
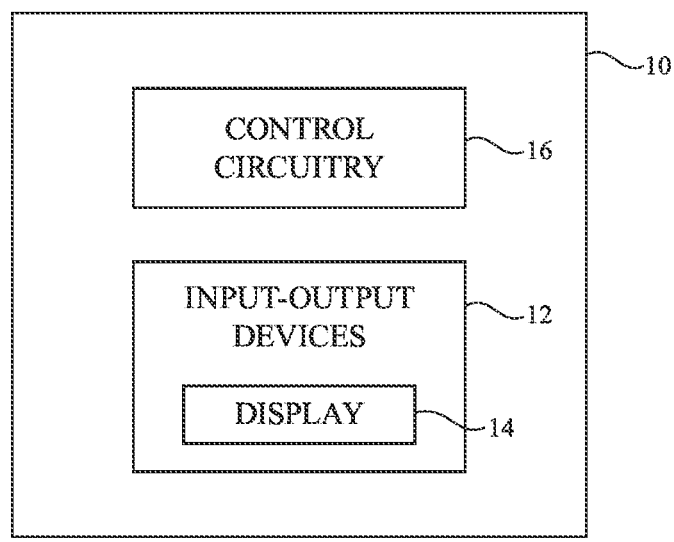
FIG. 1 is a diagram of an illustrative electronic device having a display in accordance with some embodiments.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, application processors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14. Device 10 may be a tablet computer, laptop computer, a desktop computer, a display, a cellular telephone, a media player, a wristwatch device or other wearable electronic equipment, or other suitable electronic device.

Display 14 may be an organic light-emitting diode display or may be a display based on other types of display technology. Configurations in which display 14 is an organic light-emitting diode (OLED) display are sometimes described herein as an example. This is, however, merely illustrative. Any suitable type of display may be used in device 10, if desired.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
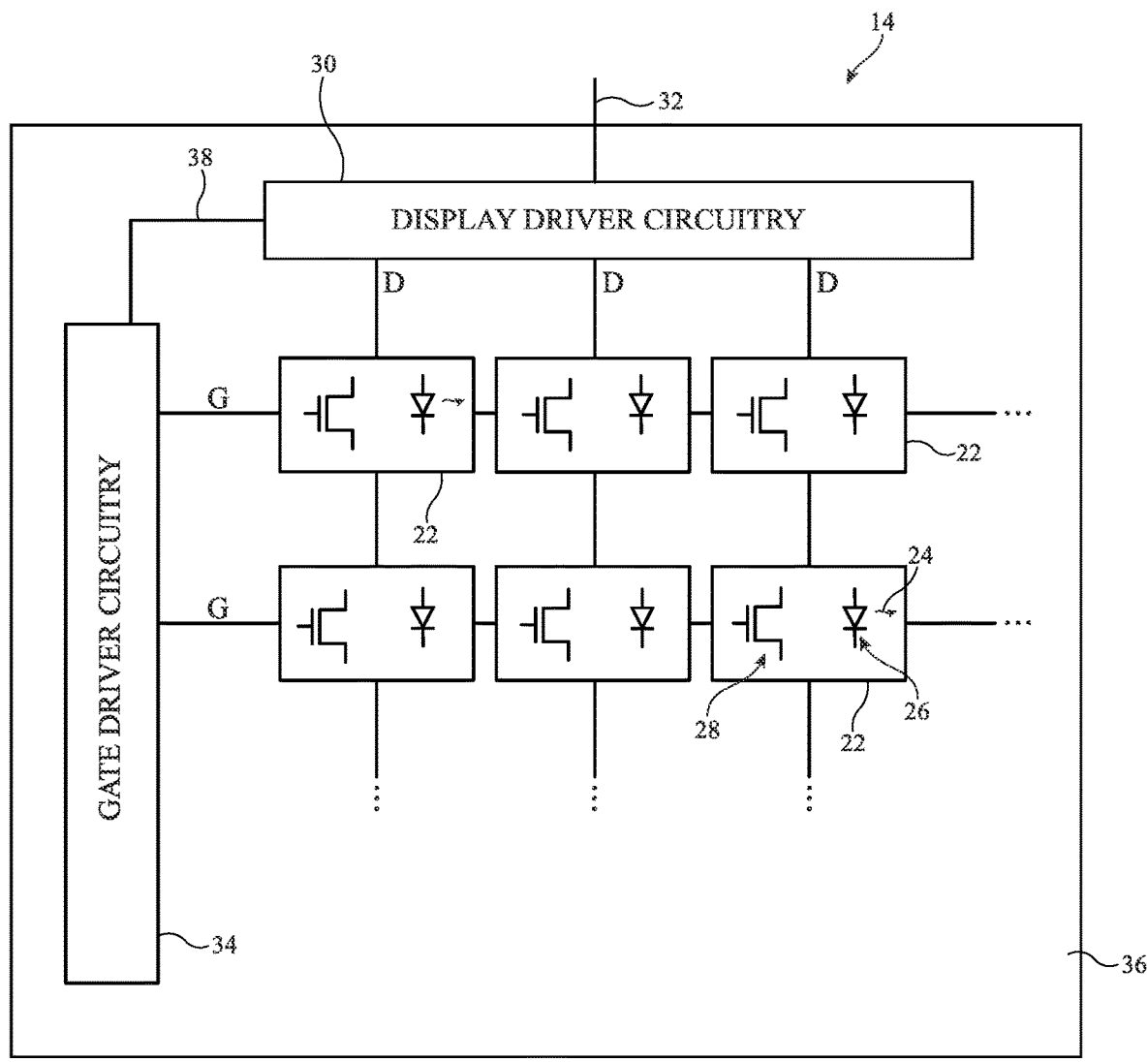
FIG. 2 is a diagram of an illustrative display having an array of organic light-emitting diode (OLED) display pixels in accordance with some embodiments.

A top view of a portion of display 14 is shown in FIG. 2. As shown in FIG. 2, display 14 may have an array of pixels 22 formed on a substrate 36. Substrate 36 may be formed from glass, metal, plastic, ceramic, porcelain, or other substrate materials. Pixels 22 may receive data signals over signal paths such as data lines D (sometimes referred to as data signal lines, column lines, etc.) and may receive one or more control signals over control signal paths such as horizontal control lines G (sometimes referred to as gate lines, scan lines, emission lines, row lines, etc.). There may be any suitable number of rows and columns of pixels 22 in display 14 (e.g., tens or more, hundreds or more, or thousands or more).

Each pixel 22 may have a light-emitting diode 26 that emits light 24 under the control of a pixel control circuit formed from thin-film transistor circuitry such as thin-film transistors 28 and thin-film capacitors). Thin-film transistors 28 may be polysilicon thin-film transistors, semiconducting oxide thin-film transistors such as indium zinc gallium oxide transistors, or thin-film transistors formed from other semiconductors. Pixels 22 may contain light-emitting diodes of different colors (e.g., red, green, and blue) to provide display 14 with the ability to display color images.

Display driver circuitry 30 may be used to control the operation of pixels 22. The display driver circuitry 30 may be formed from integrated circuits, thin-film transistor circuits, or other suitable electronic circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply circuitry 30 with information on images to be displayed on display 14.

To display the images on display pixels 22, display driver circuitry 30 may supply image data to data lines D (e.g., data lines that run down the columns of pixels 22) while issuing clock signals and other control signals to supporting display driver circuitry such as gate driver circuitry 34 over path 38. If desired, display driver circuitry 30 may also supply clock signals and other control signals to gate driver circuitry 34 on an opposing edge of display 14 (e.g., the gate driver circuitry may be formed on more than one side of the display pixel array).

Gate driver circuitry 34 (sometimes referred to as horizontal line control circuitry or row driver circuitry) may be implemented as part of an integrated circuit and/or may be implemented using thin-film transistor circuitry. Horizontal/row control lines G in display 14 may carry gate line signals (scan line control signals), emission enable control signals, and/or other horizontal control signals for controlling the pixels of each row. There may be any suitable number of horizontal control signals per row of pixels 22 (e.g., one or more row control lines, two or more row control lines, three or more row control lines, four or more row control lines, five or more row control lines, etc.).

Figure 3:
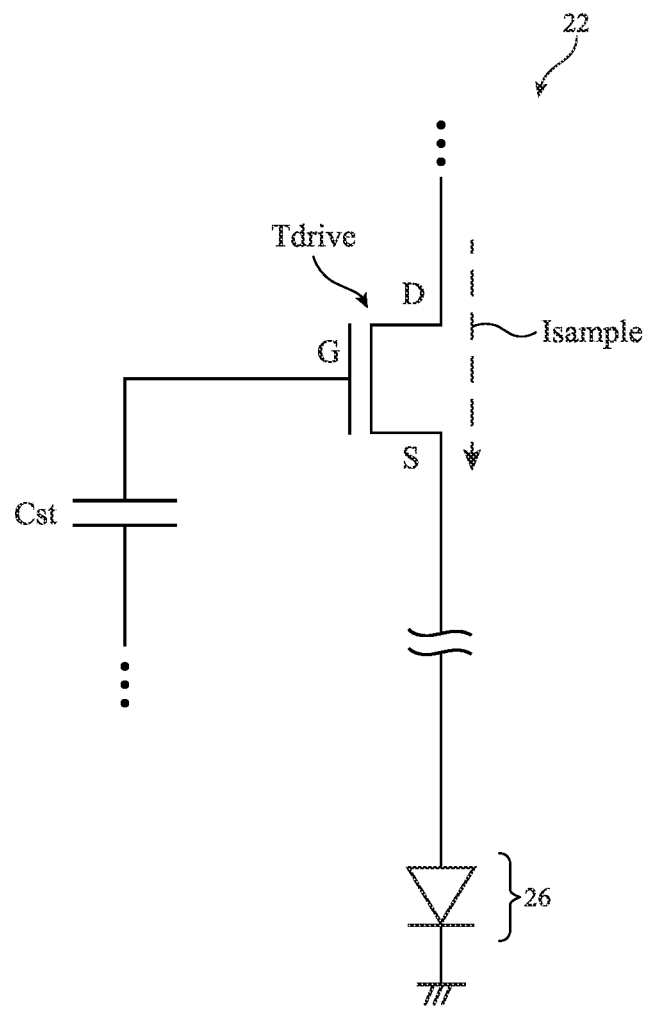
FIG. 3 is a diagram illustrating a sampling current during a threshold voltage sampling phase in accordance with some embodiments.

FIG. 3 is a diagram showing a portion of display pixel 22. As shown in FIG. 3, pixel 22 may include at least a drive transistor such as transistor Tdrive, a storage capacitor such as capacitor Cst, and light-emitting diode 26. Pixel 22 may also include other transistors such as data loading transistors, emission control transistors, anode reset transistors, initialization transistors, biasing transistors, etc. Drive transistor Tdrive is configured to provide a drive current to diode 26 and has a gate (G) terminal, a drain (D) terminal, and a source (S) terminal. The terms "source" and "drain" terminals that are used to describe current-conducting terminals of a transistor are sometimes interchangeable and may be referred to herein as "source-drain" terminals. Storage capacitor Cst may be coupled to the gate terminal of transistor Tdrive and may be configured to store a data signal value for pixel 22.

In practice, display pixel 22 may be subject to process, voltage, and temperature (PVT) variations. Due to such variations, transistor threshold voltages between different display pixels 22 can vary. Variations in the threshold voltage of the drive transistor can cause different display pixels 22 to produce amounts of light that do not match the desired image. In an effort to mitigate threshold voltage variations, display pixel 22 of the type shown in FIG. 3 may be operable to support in-pixel threshold voltage (Vt) compensation. In-pixel threshold voltage compensation operations, sometimes referred to as in-pixel Vt canceling operations, may generally include at least an initialization phase, a Vt sampling phase, a data programming phase, and an emission phase (in that order). During the Vt sampling phase, the threshold voltage of transistor Tdrive may be sampled using storage capacitor Cst. Subsequently, during the emission phase, an emission current flowing from transistor Tdrive into the light-emitting diode 26 has a term that cancels out with the sampled Vt level. As a result, the emission current will be independent of the drive transistor threshold voltage Vt and will therefore be less sensitive to Vt variations at the drive transistor. During the Vt sampling phase, a sampling current can flow through transistor Tdrive as indicated by current Isample.

The sampling current level Isample may affect a display's sensitivity to temperature. For example, a display's luminance can vary as a function of temperature. Such variation is defined herein as temperature luminance sensitivity. Experiments have shown that higher sampling current levels translate to greater temperature luminance sensitivity especially at low gray levels, whereas lower sampling current levels translate to lower temperature luminance sensitivity for low gray levels. Temperature luminance sensitivity may be defined as a percentage change in display luminance in response to a predetermined change in temperature. It is generally desirable to keep the temperature luminance sensitivity as close to zero as possible to minimize the display's sensitivity to temperature.

Figure 4:
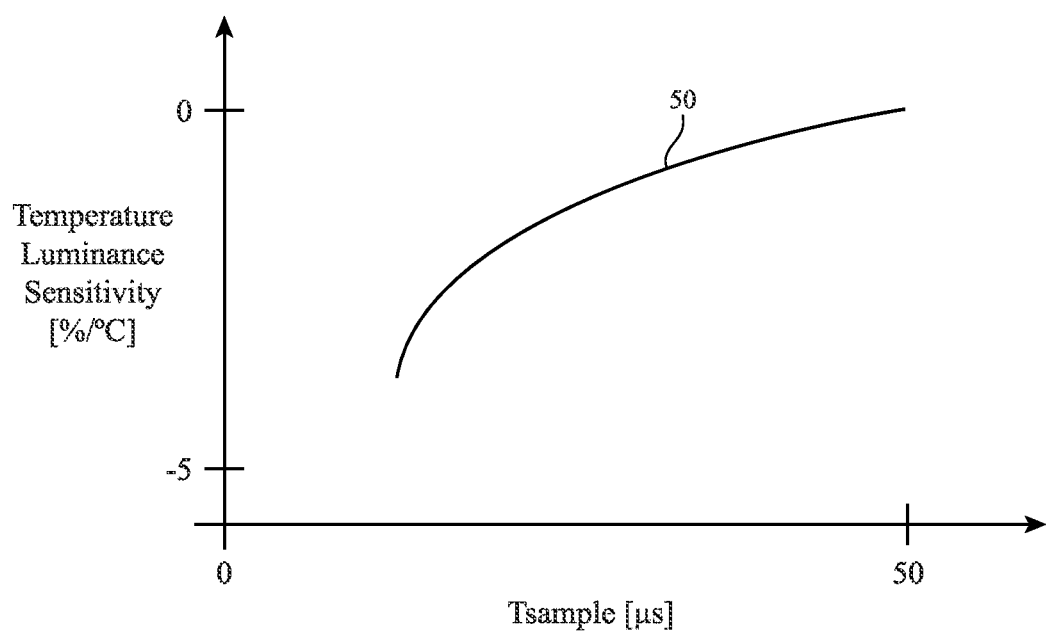
FIG. 4 is a plot showing how temperature luminance sensitivity in a display varies as a function of threshold voltage sampling duration in accordance with some embodiments.

In accordance with an embodiment, sampling current Isample can be reduced by lengthening the duration of the Vt sampling phase. FIG. 4 plots a characteristic curve 50 showing how temperature luminance sensitivity in a display varies as a function of threshold voltage sampling duration Tsample. As shown in FIG. 4, curve 50 approaches 0%/° C. as the threshold voltage sampling time Tsample is increased. In other words, increasing the Tsample duration can help reduce a display's sensitivity to temperature. In conventional display pixel architectures, the Vt sampling duration is, however, limited by the duration of the data programming period (i.e., the data programming period is typically limited to one row time, which is set by the performance requirements of the display).

Figure 5A:
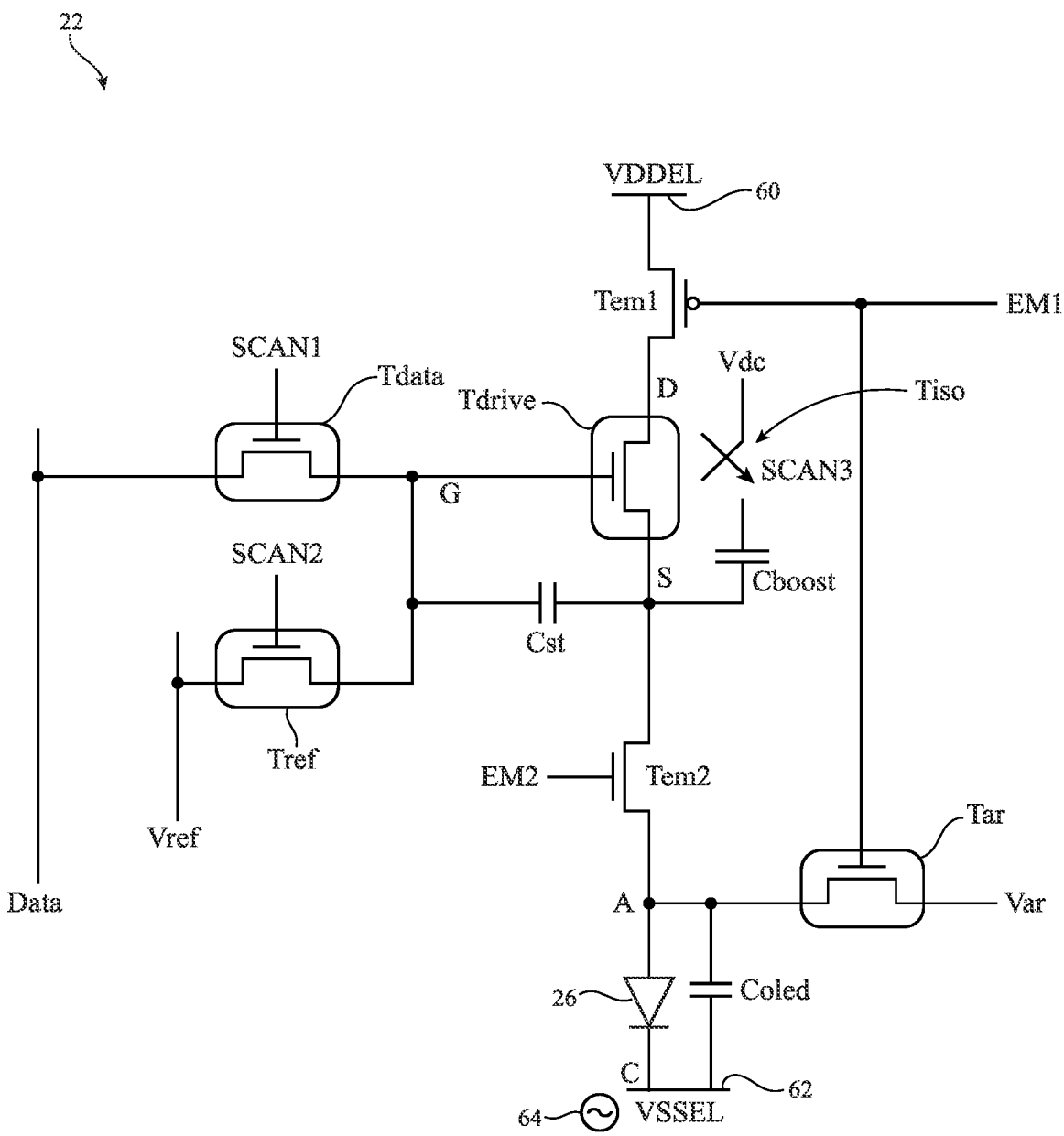
FIG. 5A is a circuit diagram of an illustrative display pixel operable to perform an extended threshold voltage sampling phase separately from a data programming phase in accordance with some embodiments.

In accordance with an embodiment, FIG. 5A is a circuit diagram of an illustrative display pixel 22 operable to reduce temperature luminance sensitivity by separating the threshold voltage sampling phase from the data programming phase and extending the duration of the threshold voltage sampling phase to reduce temperature luminance sensitivity. As shown in FIG. 5A, display pixel 22 may include a light-emitting element such as an organic light-emitting diode 26, a capacitor such as storage capacitor Cst, and thin-film transistors such a drive transistor Tdrive, a gate-voltage-setting transistor Tref, a data loading transistor Tdata, an anode reset transistor Tar, and emission control transistors Tem1 and Tem2. Emission control transistors Tem1 and Tem2 are sometimes referred to as emission transistors. At least some or all of the transistors within pixel 22 are semiconducting oxide transistors. Semiconducting oxide transistors are defined as thin-film transistors having a channel region formed from semiconducting oxide material (e.g., indium gallium zinc oxide or IGZO, indium tin zinc oxide or ITZO, indium gallium tin zinc oxide or IGTZO, indium tin oxide or ITO, or other semiconducting oxide material) and are generally considered n-type (n-channel) transistors.

A semiconducting oxide transistor is notably different than a silicon transistor (i.e., a transistor having a polysilicon channel region deposited using a low temperature process sometimes referred to as LTPS or low-temperature polysilicon). Semiconducting oxide transistors exhibit lower leakage than silicon transistors, so implementing at least some of the transistors within pixel 22 can help reduce flicker (e.g., by preventing current from leaking away from the gate terminal of drive transistor Tdrive).

If desired, at least some of the transistors within pixel 22 may be implemented as silicon transistors such that pixel 22 has a hybrid configuration that includes a combination of semiconducting oxide transistors and silicon transistors (e.g., n-type LTPS transistors or p-type LTPS transistors). In yet other suitable embodiments, pixel 22 may include additional initialization transistors for apply an initialization or reference voltage to one or more internal nodes within pixel 22. As another example, display pixel 22 may further include additional switching transistors (e.g., one or more additional semiconducting oxide transistors or silicon transistors) for applying one or more bias voltages for improving the performance or operation of pixel 22. Illustrative configurations in which pixel 22 includes both silicon transistors and semiconducting oxide transistors may sometimes be described herein as an example.

In the example of FIG. 5A, transistors Tdrive, Tdata, Tref, and Tar are implemented as semiconducting oxide transistors (e.g., n-type semiconducting oxide transistors). Emission transistor Tem1 is implemented as a p-type (p-channel) silicon transistor, whereas emission transistor Tem2 is implemented as an n-type (n-channel) silicon transistor. If desired, transistor Tar can alternatively be implemented as an n-type silicon transistor. In general, n-type semiconducting oxide and silicon transistors are "active-high" devices (e.g., switches that are activated or turned on when the voltage at the gate terminals are driven high), whereas p-type silicon transistors are "active-low" devices (e.g., switches that are deactivated or turned off when the voltage at the gate terminals are driven low).

Drive transistor Tdrive has a gate terminal G, a drain terminal D (sometimes referred to as a first source-drain terminal), and a source terminal S (sometimes referred to as a second source-drain terminal). Transistor Tdrive, emission control transistors Tem1 and Tem2, and light-emitting diode 26 are coupled in series between positive power supply line 60 and ground power supply line 62. Light-emitting diode 26 may have an associated diode capacitance Coled. Emission transistor Tem1 may have a gate terminal configured to receive first emission control signal EM1, whereas transistor Tem2 has a gate terminal configured to receive a second emission control signal EM2. This example in which transistors Tem1 and Tem2 receive different emission signals is merely illustrative. In other embodiments, transistors Tem1 and Tem2 can receive the same emission control signal.

A positive power supply voltage VDDEL may be supplied to positive power supply terminal 60, whereas a ground power supply voltage VSSEL may be supplied to ground power supply terminal 62. Positive power supply voltage VDD may be 3 V, 4 V, 5 V, 6 V, 7 V, 2 to 8 V, greater than 6 V, greater than 8 V, greater than 10 V, greater than 12 V, 6-12 V, 12-20 V, or any suitable positive power supply voltage level. Ground power supply voltage VSSEL may be 0 V, −1 V, −2 V, −3 V, −4 V, −5 V, −6V, −7 V, less than 2 V, less than 1 V, less than 0 V, or any suitable ground or negative power supply voltage level. During emission phase, signals EM1 and EM2 can be asserted to turn on transistors Tem1 and Tem2, which allows current to flow from drive transistor Tdrive to diode 26. The degree to which drive transistor Tdrive is turned on controls the amount of current flowing from terminal 60 to terminal 62 through diode 26 and therefore the amount of emitted light from display pixel 22.

In the example of FIG. 5A, storage capacitor Cst may be coupled between the gate and source terminals of drive transistor Tdrive. Data loading transistor Tdata may have a first source-drain terminal coupled to the gate terminal of transistor Tdrive, a second source-drain terminal coupled to a data line (e.g., a column line carrying the Data signal), and a gate terminal configured to receive a first scan control signal SCAN1. Transistor Tref may have a first source-drain terminal coupled to the gate terminal of transistor Tdrive, a second source-drain terminal coupled to a reference voltage Vref via a reference voltage line (e.g., a column line carrying reference voltage Vref), and a gate terminal configured to receive a second scan control signal SCAN2. Transistor Tref that is operable to pass reference voltage Vref onto the gate terminal of transistor Tdrive may therefore sometimes be referred to as a gate-voltage-setting transistor. Voltage Vref may be a fixed voltage level that is equal to VDDEL, less than VDDEL, or some other voltage level between VSSEL and VDDEL.

Anode reset transistor Tar may have a first source-drain terminal coupled to the anode terminal of diode 26 (sometimes referred to as the anode electrode), a second source-drain terminal configured to receive an anode reset voltage via an anode reset voltage line (e.g., a column line carrying anode reset voltage Var), and a gate terminal configured to receive first emission control signal EM1. Diode 26 has a cathode terminal (sometimes referred to as the cathode electrode) coupled to VSSEL ground power supply line 62 (sometimes referred to as the common power supply line).

In some electronic devices, the cathode terminal can be subject to noise (see, e.g., cathode noise source 64). This cathode noise 64 might arise due to other signaling components disposed in the vicinity of the display stack, such as from touch sensor electrodes that are sometimes formed overlapping with the cathode layer. Thus, any potential signal perturbations from the overlapping touch sensor electrodes can be inadvertently coupled onto the VSSEL ground line.

Display pixel 22 also includes an additional capacitor Cboost coupled between the source terminal of transistor Tdrive and a direct-current voltage Vdc. Voltage Vdc can be shorted to VDDEL, VSSEL, Vref, Var, or other available/existing DC or static supply voltage within pixel 22. Device configurations in which Vdc is shorted to VDDEL is sometimes described as an example herein. Configured in this way, the drive current of pixel 22 will be proportional to

[(Coled+Cboost)/(Cst+Coled+Cboost)]. By appropriately sizing capacitor Cboost, the attenuation of the drive current caused by Coled can be decreased for certain data voltage ranges. Thus, capacitor Cboost serves to boost the drive current levels and is therefore sometimes referred to as a current boosting capacitor.

During emission, cathode noise 64 can be inadvertently coupled to Vdc (e.g., to the VDDEL line) via the diode capacitance Coled and via current boosting capacitor Cboost. Such noise being coupled to Vdc can affect the value of data signals being loaded into pixels 22, which can lead to undesirable display artifacts. To mitigate such potential noise effects, pixel 22 is provided with an isolation device such as isolation switch Tiso coupled in series with capacitor Cboost between the source terminal of transistor Tdrive and the Vdc voltage line. During emission periods, switch Tiso can be deactivated (turned off) to prevent the cathode noise 64 from being coupled to voltage Vdc. By blocking this capacitive coupling path between the cathode and Vdc, any negative or undesirable effects associated with such noise coupling can be mitigated. Switch Tiso is therefore sometimes referred to as a noise blocking, noise isolation, or noise decoupling switch. Switch Tiso can be a semiconducting oxide transistor, an n-type silicon transistor, or a p-type silicon transistor.

Figure 5B:
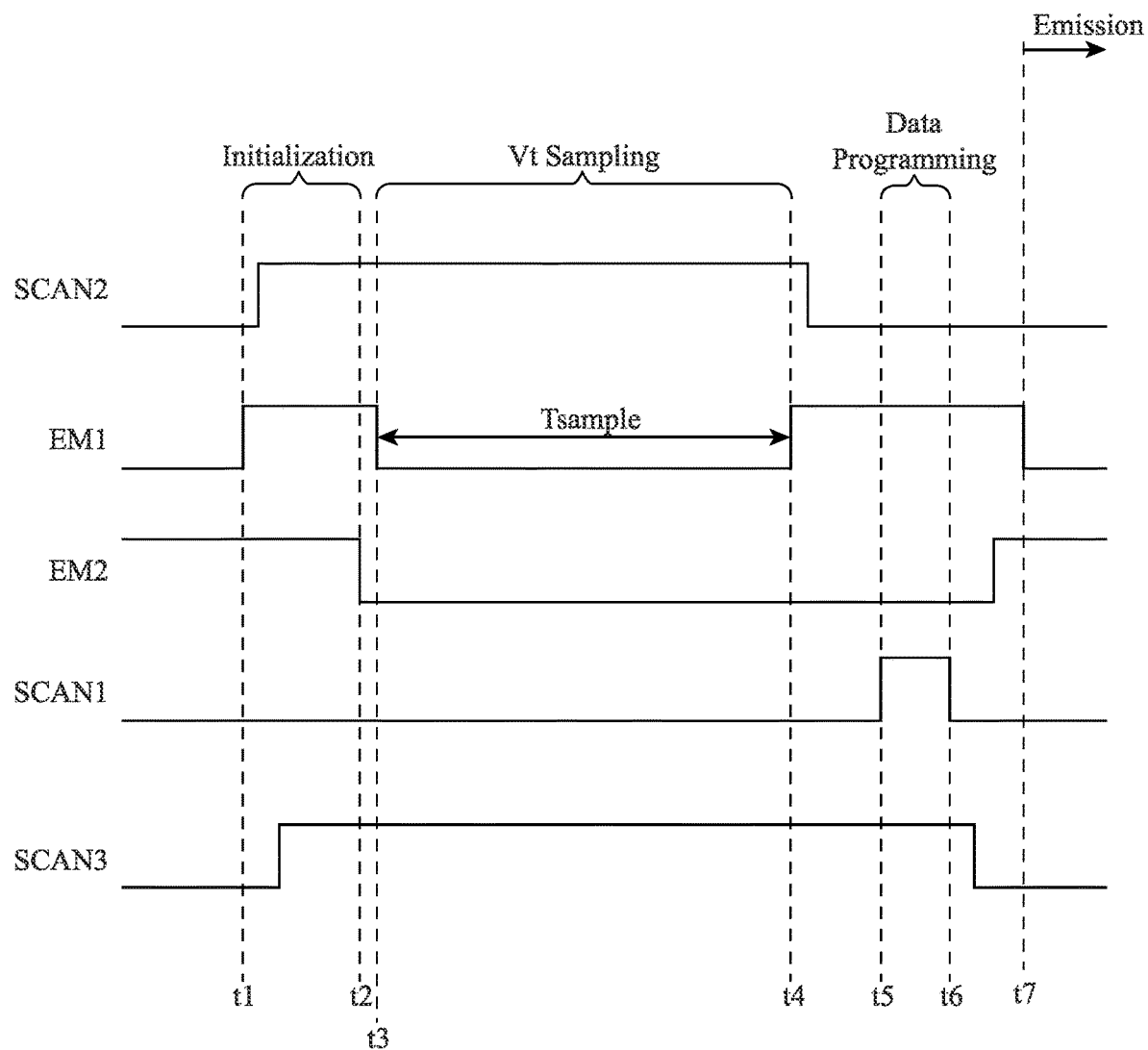
FIG. 5B is a timing diagram illustrating the behavior of relevant control waveforms during a refresh operation of the pixel shown in FIG. 5A in accordance with some embodiments.

FIG. 5B is a timing diagram illustrating a refresh operation of display pixel 22 of the type shown in FIG. 5A. Prior to time t1, second emission signal EM2 is high.

At time t1, first emission control signal EM1 is pulsed high to temporarily activate anode reset transistor Tar. Activating anode reset transistor Tar biases the anode terminal of diode 26 to the anode reset voltage level Var. Since second emission control signal EM2 is high during this time, the source terminal of transistor Tdrive will also be biased to reset voltage Var. Some time after t1, scan signal SCAN2 can be asserted (driven high) to activate (turn on) transistor Tref. Activating transistor Tref drives the gate terminal of transistor Tdrive to the reference voltage level Vref. While signal SCAN2 is asserted, the gate-to-source voltage Vgs of transistor Tdrive will therefore be biased to (Vref−Var). This period between time t1 and t2 during which the Vgs of transistor Tdrive is initialized to a known voltage difference and where the anode terminal is reset to voltage Var is sometimes referred to as the initialization phase. Signal SCAN3 is then driven high sometime during the initialization phase to turn on isolation switch Tiso (e.g., to switch boosting capacitor Cboost into use). At the end of the initialization phase (at time t2), second emission control signal EM2 is driven low to turn off transistor Tem2.

At time t3, first emission control signal EM1 is pulsed low to turn on transistor Tem1. Turning on transistor Tem1 drives the drain terminal of transistor Tdrive up to VDDEL, which will result in the source terminal of transistor Tdrive to charge up to one Vt below the Vref level at the gate of transistor Tdrive. In other words, the source terminal of transistor Tdrive will charge up to (Vref−Vt). Thus, the voltage sampled across storage capacitor during this time will be equal to (Vref−[Vref−Vt]), which is equal to Vt. At time t4, emission signal EM1 is driven high to turn off transistor Tem1 and signal SCAN2 is driven low to turn off transistor Tref. This time period from t3 to t4 during which Vt is sampled across storage capacitor Cst is referred to as the Vt sampling phase having a Vt sampling duration Tsample.

At time t5, scan signal SCAN1 is pulsed high to turn on transistor Tdata. Activating transistor Tdata drives the gate terminal of transistor Tdrive to data voltage Vdata corresponding to a new data signal value for pixel 22. Since transistor Tem2 is turned off at this time, the source terminal of transistor Tdrive is a high impedance node so capacitor Cst cannot discharge (e.g., the voltage across capacitor Cst will remain equal to Vt even though the drive transistor gate terminal will be driven to a new Vdata level). This time period from time t5 to t6 during which transistor Tdata is activated to load in data voltage Vdata is referred to as the data programming phase.

At time t7, emission signals EM1 and EM2 are both asserted to begin the emission phase during which diode 26 can emit an amount of light that is proportional to voltage Vdata. During the emission phase, the resulting Vgs of transistor Tdrive will be equal to [Vdata−(Vref−Vt)]. Since the final emission current is proportional to Vgs minus Vt, the emission current will be independent of Vt since (Vgs−Vt) will be equal to (Vdata−Vref+Vt−Vt), where Vt cancels out. This type of operating scheme where the drive transistor threshold voltage is internally sampled and canceled out in this way is sometimes referred to as in-pixel threshold voltage compensation. The time period from t1 to t6, which includes the initialization phase, Vt sampling phase, and data programming phase, is sometimes referred to as a data refresh period. Signal SCAN4 is asserted during data refresh operations to ensure proper data loading with the desired amount of current boosting. Signal SCAN4 is, however, deasserted during emission periods to isolate or block any potential cathode noise from leaking into one or more DC (static) voltage nodes (e.g., Vdc) in pixel 22.

To minimize a display's sensitivity to temperature variations, the Vt sampling phase duration Tsample can be extended, which reduces the Vt sampling current level. Decoupling the Vt sampling phase from the data programming phase allows the Vt sampling phase duration to be lengthened independently from the data programming phase duration, which is typically limited to one row time as set by the performance requirements of the display. In some embodiments, the Vt sampling phase duration (i.e., time period Tsample) can be ten to twenty times longer than the data programming phase duration (i.e., the pulse width of SCAN1). In general, the Vt sampling phase duration Tsample can be at least 2 times, 5 times, 2-5 times, 10 times, 5-10 times, 10-20 times, or more than 20 times longer than the data programming phase duration. The duration of the Vt sampling phase can also be dynamically adjusted depending on the degree to which display temperature luminance sensitivity needs to be suppressed. In general, a longer Vt sampling phase duration would reduce the temperature luminance sensitivity.

The example of FIG. 5A in which emission transistor Tem1 is implemented as a p-type silicon transistor and emission transistor Tem2 is implemented as an n-type silicon transistor is merely illustrative. FIG. 6A illustrates another suitable embodiment of pixel 22 in which emission transistor Tem1 is implemented as a semiconducting oxide transistor and emission transistor Tem2 is implemented as a p-type silicon transistor. Moreover, anode reset transistor Tar can be implemented as a p-type silicon transistor. The remaining structure of pixel 22 is identical to that already described in connection with FIG. 5A and need not be reiterated in detail to avoid obscuring the present embodiment.

Figure 6B:
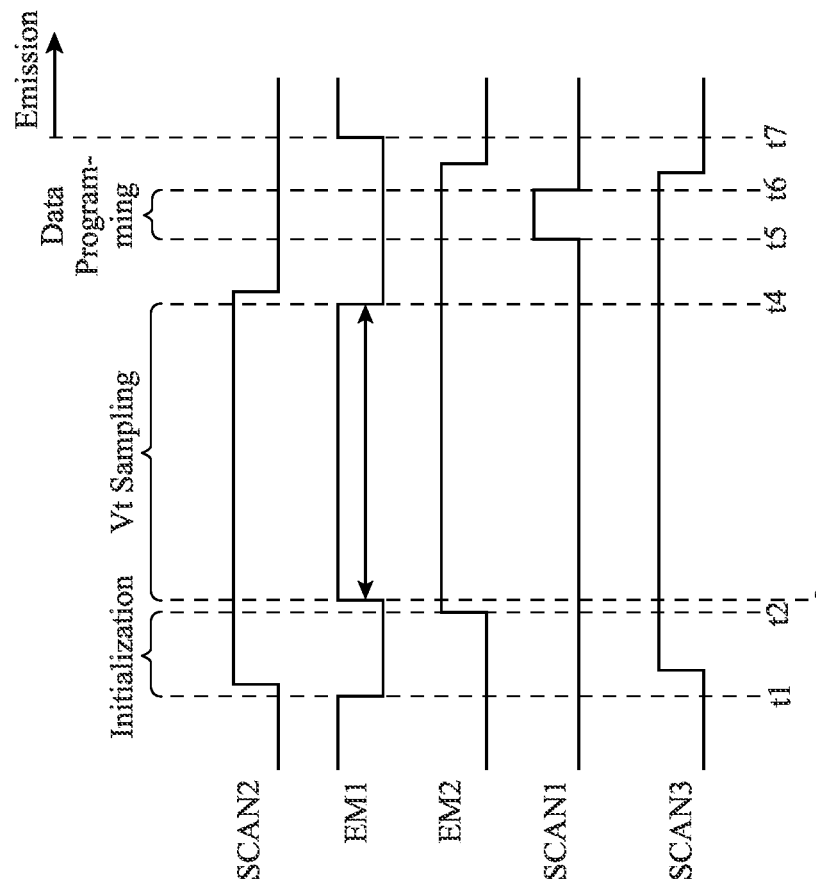
FIG. 6B is a timing diagram illustrating the behavior of relevant control waveforms during a refresh operation of the pixel shown in FIG. 6A in accordance with some embodiments.
Figure 6A:
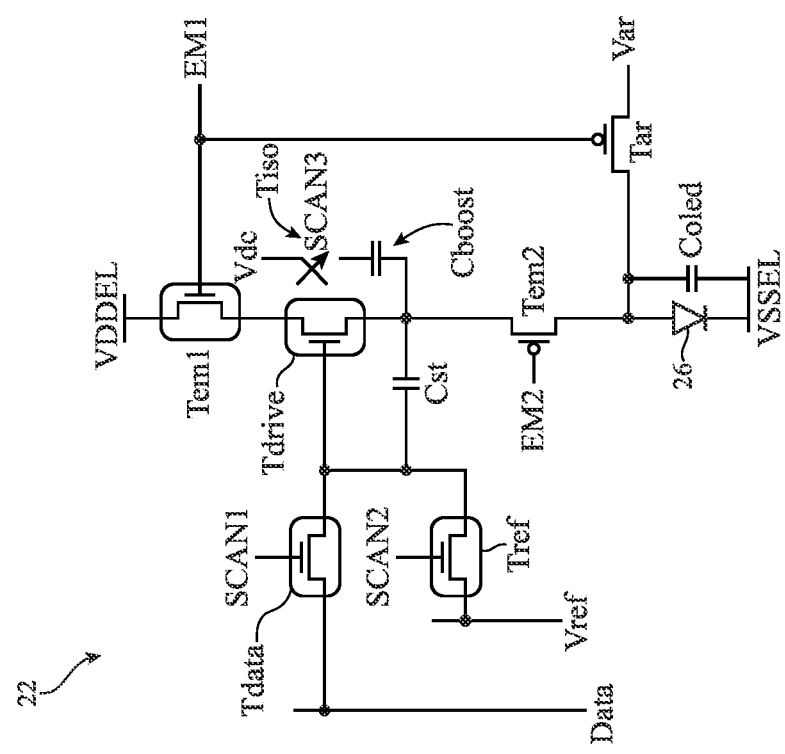
FIG. 6A is a circuit diagram showing another implementation of an illustrative display pixel operable to perform an extended threshold voltage sampling phase separately from a data programming phase in accordance with some embodiments.

FIG. 6B is a timing diagram illustrating a refresh operation of display pixel 22 of the type shown in FIG. 6A. Since signal EM1 that controls transistor Tem1 is now an active-high signal, the polarity of signal EM1 may be inverted relative to that shown in FIG. 5B. Similarly, since signal EM2 that controls transistor Tem2 is now an active-low signal, the polarity of signal EM2 may be inverted relative to that shown in FIG. 5B. Otherwise, the principals and the phases for operating pixel 22 of the type shown in FIG. 6A remain the same as that already described with respect to FIG. 5B and need not be reiterated in detail for the sake of clarity.

The example of FIG. 6A in which transistor Tar is implemented as a p-type silicon transistor is merely illustrative. FIG. 16A illustrates another suitable embodiment of pixel 22 in which transistors Tiso, Tar, and Tem2 are all implemented as n-type transistors. If desired, all of the thin-film transistors with pixel 22 of FIG. 16A can be implemented as n-type semiconducting oxide transistors (e.g., transistors Tdrive, Tdata, Tref, Tem1, Tem2, Tiso, and Tar are all implemented as semiconducting oxide transistors). In particular, isolation transistor Tiso may have a first source-drain terminal coupled to capacitor Cboost, a second source-drain terminal coupled to voltage Vdc, and a gate terminal configured to receive a third scan signal SCAN3. Anode reset transistor may have a first source-drain terminal coupled to the anode terminal of diode 26, a second source-drain terminal configured to receive voltage Var, and a gate terminal configured to receive the third scan signal SCAN3. The remaining structure of pixel 22 is identical to that already described in connection with FIG. 6A and need not be reiterated in detail to avoid obscuring the present embodiment.

FIG. 16B is a timing diagram illustrating a refresh operation of display pixel 22 of the type shown in FIG. 16A. Since signal EM2 controlling n-type transistor Tem2 is now an active-high signal, the polarity of signal EM2 may be inverted relative to that shown in FIG. 6B. Otherwise, the principals and the phases for operating pixel 22 of the type shown in FIG. 16A remain the same as that already described with respect to FIG. 6B and need not be reiterated in detail for the sake of clarity.

Figures 7A, 7B:
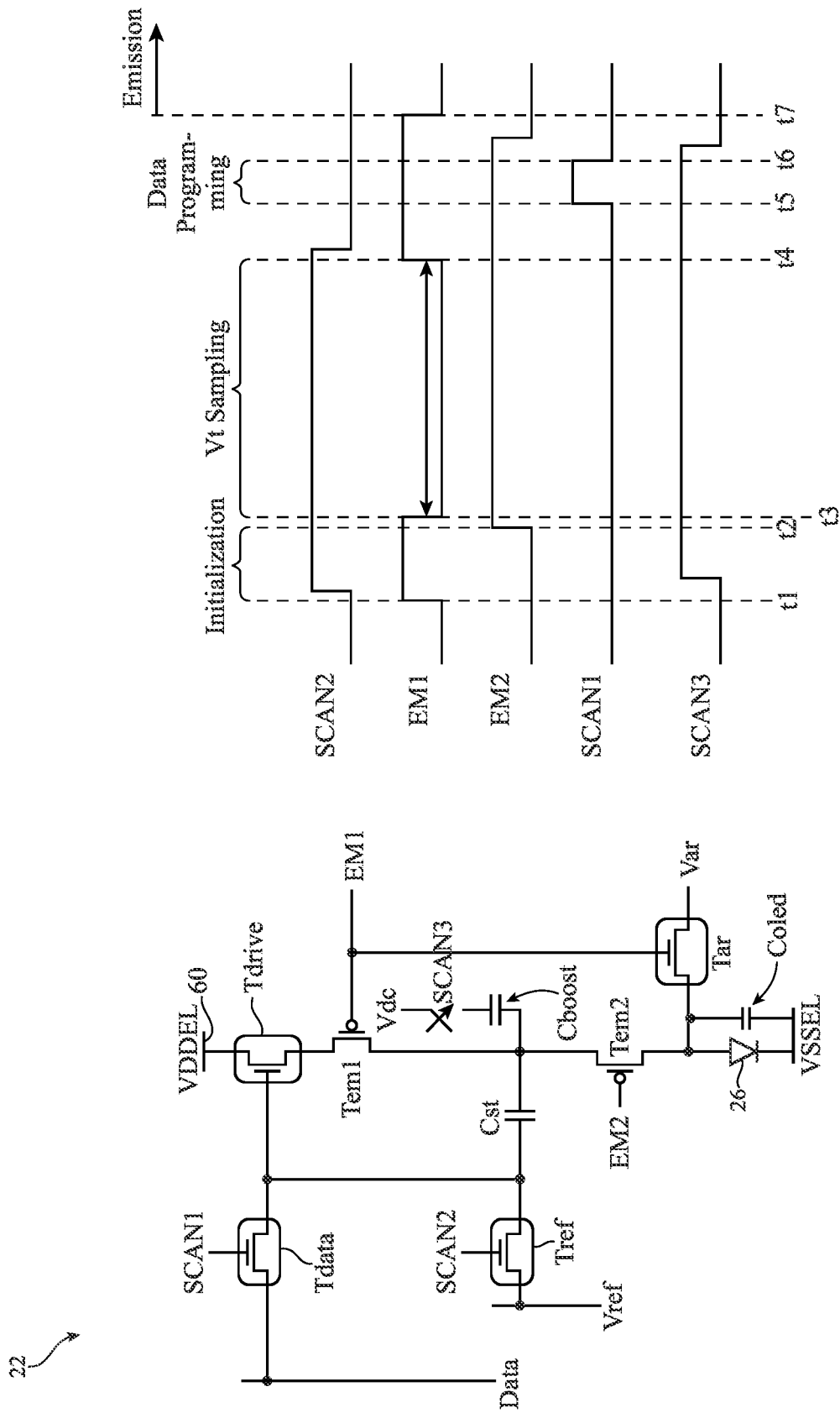
FIG. 7A is a circuit diagram showing another implementation of an illustrative display pixel operable to perform an extended threshold voltage sampling phase separately from a data programming phase in accordance with some embodiments.
FIG. 7B is a timing diagram illustrating the behavior of relevant control waveforms during a refresh operation of the pixel shown in FIG. 7A in accordance with some embodiments.

The example of FIG. 5A in which emission transistor Tem1 is coupled between positive power supply line 60 and drive transistor Tdrive is merely illustrative. FIG. 7A illustrates another suitable embodiment of pixel 22 in which the order of transistors Tdrive and Tem1 are swapped. In particular, transistor Tdrive now has its drain terminal directly coupled to positive power supply line 60 and its source terminal coupled to transistor Tem2 via transistor Tem1. Transistor Tem1 has a source terminal coupled to the source terminal of transistor Tdrive, a gate terminal configured to receive signal EM1, and a drain terminal. Storage capacitor Cst has a first terminal coupled to the gate terminal of transistor Tdrive and a second terminal coupled to the drain terminal of transistor Tem1. Capacitor Cboost is now coupled to the drain terminal of transistor Tem1. Similar to transistor Tem1, transistor Tem2 may also be implemented as a p-type silicon transistor. The remaining structure of pixel 22 is identical to that already described in connection with FIG. 5A and need not be reiterated in detail to avoid obscuring the present embodiment.

FIG. 7B is a timing diagram illustrating a refresh operation of display pixel 22 of the type shown in FIG. 7A. Prior to time t1, second emission signal EM2 is low.

At time t1, first emission control signal EM1 is pulsed high to temporarily activate anode reset transistor Tar. Activating anode reset transistor Tar biases the anode terminal of diode 26 to the anode reset voltage level Var. Since second emission control signal EM2 is low during this time, the source terminal of transistor Tdrive will also be biased to reset voltage Var. Some time after t1, scan signal SCAN2 can be asserted (driven high) to activate (turn on) transistor Tref. Activating transistor Tref drives the gate terminal of transistor Tdrive to the reference voltage level Vref. While signal SCAN2 is asserted, the gate-to-source voltage Vgs of transistor Tdrive will therefore be biased to (Vref–Var) during the initialization phase. Signal SCAN3 is then driven high sometime during the initialization phase to turn on isolation switch Tiso (e.g., to switch boosting capacitor Cboost into use). At the end of the initialization phase (at time t2), second emission control signal EM2 is driven high to turn off transistor Tem2.

At time t3, first emission control signal EM1 is pulsed low to turn on transistor Tem1. Turning on transistor Tem1 drives the drain terminal of transistor Tdrive up to VDDEL, which will result in the source terminal of transistor Tdrive to charge up to one Vt below the Vref level at the gate of transistor Tdrive. In other words, the source terminal of transistor Tdrive will charge up to (Vref–Vt) during the Vt sampling phase. Thus, the voltage sampled across storage capacitor during this time will be equal to (Vref–[Vref–Vt]), which is equal to Vt. At time t4, emission signal EM1 is driven high to turn off transistor Tem1 and signal SCAN2 is driven low to turn off transistor Tref.

At time t5, scan signal SCAN1 is pulsed high to turn on transistor Tdata during the data programming phase. Activating transistor Tdata drives the gate terminal of transistor Tdrive to data voltage Vdata corresponding to a new data signal value for pixel 22. Since transistor Tem2 is turned off at this time, the source terminal of transistor Tdrive is a high impedance node so capacitor Cst cannot discharge (e.g., the voltage across capacitor Cst will remain equal to Vt even though the drive transistor gate terminal will be driven to a new Vdata level).

At time t7, emission signals EM1 and EM2 are both asserted to begin the emission phase during which diode 26 can emit an amount of light that is proportional to voltage Vdata. During the emission phase, the resulting Vgs of transistor Tdrive will be equal to [Vdata–(Vref–Vt)]. Since the final emission current is proportional to Vgs minus Vt, the emission current will be independent of Vt since (Vgs–Vt) will be equal to (Vdata–Vref+Vt–Vt), where Vt cancels to perform in-pixel threshold voltage compensation. To minimize a display's sensitivity to temperature variations, the Vt sampling phase duration can optionally be extended (e.g., the Vt sampling phase duration can be at least 2 times, 5 times, 2-5 times, 10 times, 5-10 times, 10-20 times, or more than 20 times longer than the data programming phase duration). The duration of the Vt sampling phase can also be dynamically adjusted depending on the degree to which display temperature luminance sensitivity needs to be suppressed.

Figures 8A, 8B:
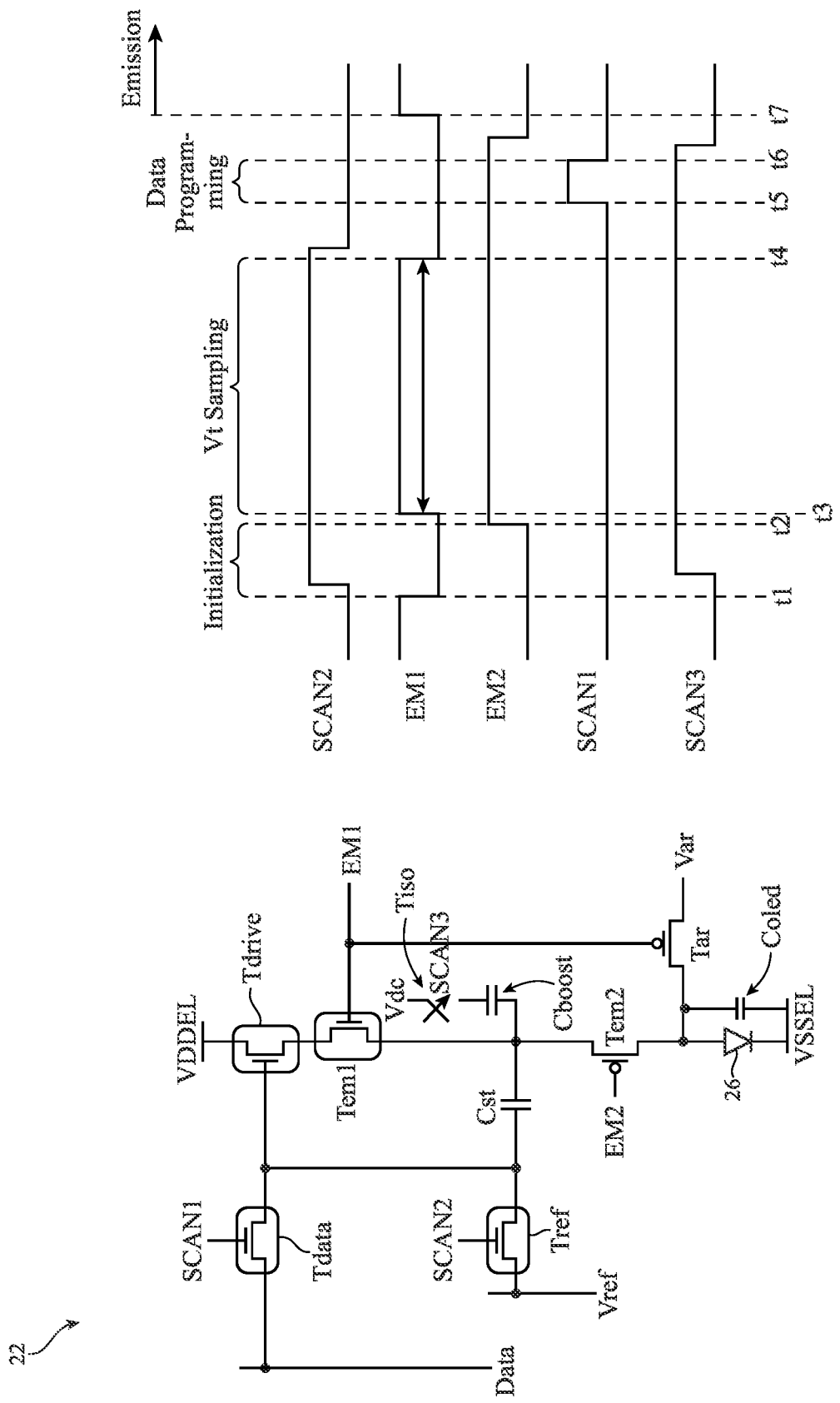
FIG. 8A is a circuit diagram showing another implementation of an illustrative display pixel operable to perform an extended threshold voltage sampling phase separately from a data programming phase in accordance with some embodiments.
FIG. 8B is a timing diagram illustrating the behavior of relevant control waveforms during a refresh operation of the pixel shown in FIG. 8A in accordance with some embodiments.

The example of FIG. 7A in which emission transistor Tem1 is implemented as a p-type silicon transistor and anode reset transistor Tar is implemented as a semiconducting oxide transistor is merely illustrative. FIG. 8A illustrates another suitable embodiment of pixel 22 in which emission transistor Tem1 is implemented as a semiconducting oxide transistor and anode reset transistor Tar is implemented as a p-type silicon transistor. The remaining structure of pixel 22 is identical to that of FIG. 7A and need not be reiterated in detail to avoid obscuring the present embodiment.

FIG. 8B is a timing diagram illustrating a refresh operation of display pixel 22 of the type shown in FIG. 7A. Since signal EM1 that controls transistor Tem1 is now an active-high signal, the polarity of signal EM1 may be inverted relative to that shown in FIG. 7B. Otherwise, the principals and the phases for operating pixel 22 of the type shown in FIG. 8A remain the same as that already described with respect to FIG. 7B and need not be reiterated in detail for the sake of clarity.

The embodiment of FIG. 5A having only one reset transistor Tar is merely illustrative. FIG. 9A illustrates another suitable embodiment of pixel 22 provided with an additional initialization transistor such as transistor Tini. As shown in FIG. 9A, initialization transistor Tini has a first source-drain terminal coupled to the source terminal of transistor Tdrive, a drain terminal configured to receive an initialization voltage Vini via an initialization line (e.g., a column line carrying Vini), and a gate terminal configured to receive scan signal SCAN3. Voltage Vini may be equal to or different than voltage Var. In one example, Vini may be greater than Var. In another example, Vini may be less than Var. Transistor Tar is a p-type silicon transistor having a gate terminal also configured to receive signal SCAN3. Emission transistor Tem2 is a p-type silicon transistor. Noise decoupling switch Tiso is now controlled by a fourth scan control signal SCAN4. The remaining structure of pixel 22 is similar to that of FIG. 5A and need not be reiterated in detail to avoid obscuring the present embodiment. Transistors Tar and Tini are sometimes referred to interchangeably as "reset" transistors.

FIG. 9B is a timing diagram illustrating a refresh operation of display pixel 22 of the type shown in FIG. 9A. Prior to time t1, emission control signals EM1 and EM2 can also be driven high to turn off the emission transistors Tem1 and Tem2. Signal EM2 can remain high for the remainder of the refresh operation (e.g., to keep transistor Tem2 off until the start of emission).

At time t1, signal SCAN3 is pulsed low to temporarily activate anode reset transistor Tar and initialization transistor Tini. Activating anode reset transistor Tar biases the anode terminal of diode 26 to the anode reset voltage level Var. Activating initializing transistor Tini biases the source terminal of transistor Tdrive to the initialization voltage level Vini. Some time after t1, scan signal SCAN2 can be asserted (driven high) to activate (turn on) transistor Tref. Activating transistor Tref drives the gate terminal of transistor Tdrive to the reference voltage level Vref. While signal SCAN3 is asserted, the gate-to-source voltage Vgs of transistor Tdrive will therefore be biased to (Vref−Vini) during the initialization phase. Signal SCAN4 is then driven high sometime during the initialization phase to turn on isolation switch Tiso (e.g., to switch boosting capacitor Cboost into use).

At time t3, first emission control signal EM1 is pulsed low to turn on transistor Tem1. Turning on transistor Tem1 drives the drain terminal of transistor Tdrive up to VDDEL, which will result in the source terminal of transistor Tdrive to charge up to one Vt below the Vref level at the gate of transistor Tdrive. In other words, the source terminal of transistor Tdrive will charge up to (Vref−Vt) during the Vt sampling phase. Thus, the voltage sampled across storage capacitor during this time will be equal to (Vref−[Vref−Vt]), which is equal to Vt. At time t4, emission signal EM1 is driven high to turn off transistor Tem1 and signal SCAN2 is driven low to turn off transistor Tref.

At time t5, scan signal SCAN1 is pulsed high to turn on transistor Tdata during the data programming phase. Activating transistor Tdata drives the gate terminal of transistor Tdrive to data voltage Vdata corresponding to a new data signal value for pixel 22. Since transistors Tem2 and Tini are turned off at this time, the source terminal of transistor Tdrive is a high impedance node so capacitor Cst cannot discharge (e.g., the voltage across capacitor Cst will remain equal to Vt even though the drive transistor gate terminal will be driven to a new Vdata level).

At time t7, emission signals EM1 and EM2 are both asserted to begin the emission phase during which diode 26 can emit an amount of light that is proportional to voltage Vdata. During the emission phase, the resulting Vgs of transistor Tdrive will be equal to [Vdata−(Vref−Vt)]. Since the final emission current is proportional to Vgs minus Vt, the emission current will be independent of Vt since (Vgs−Vt) will be equal to (Vdata−Vref+Vt−Vt), where Vt cancels to perform in-pixel threshold voltage compensation. To minimize a display's sensitivity to temperature variations, the Vt sampling phase duration can optionally be extended (e.g., the Vt sampling phase duration can be at least 2 times, 5 times, 2-5 times, 10 times, 5-10 times, 10-20 times, or more than 20 times longer than the data programming phase duration). The duration of the Vt sampling phase can also be dynamically adjusted depending on the degree to which display temperature luminance sensitivity needs to be suppressed.

Figure 10:
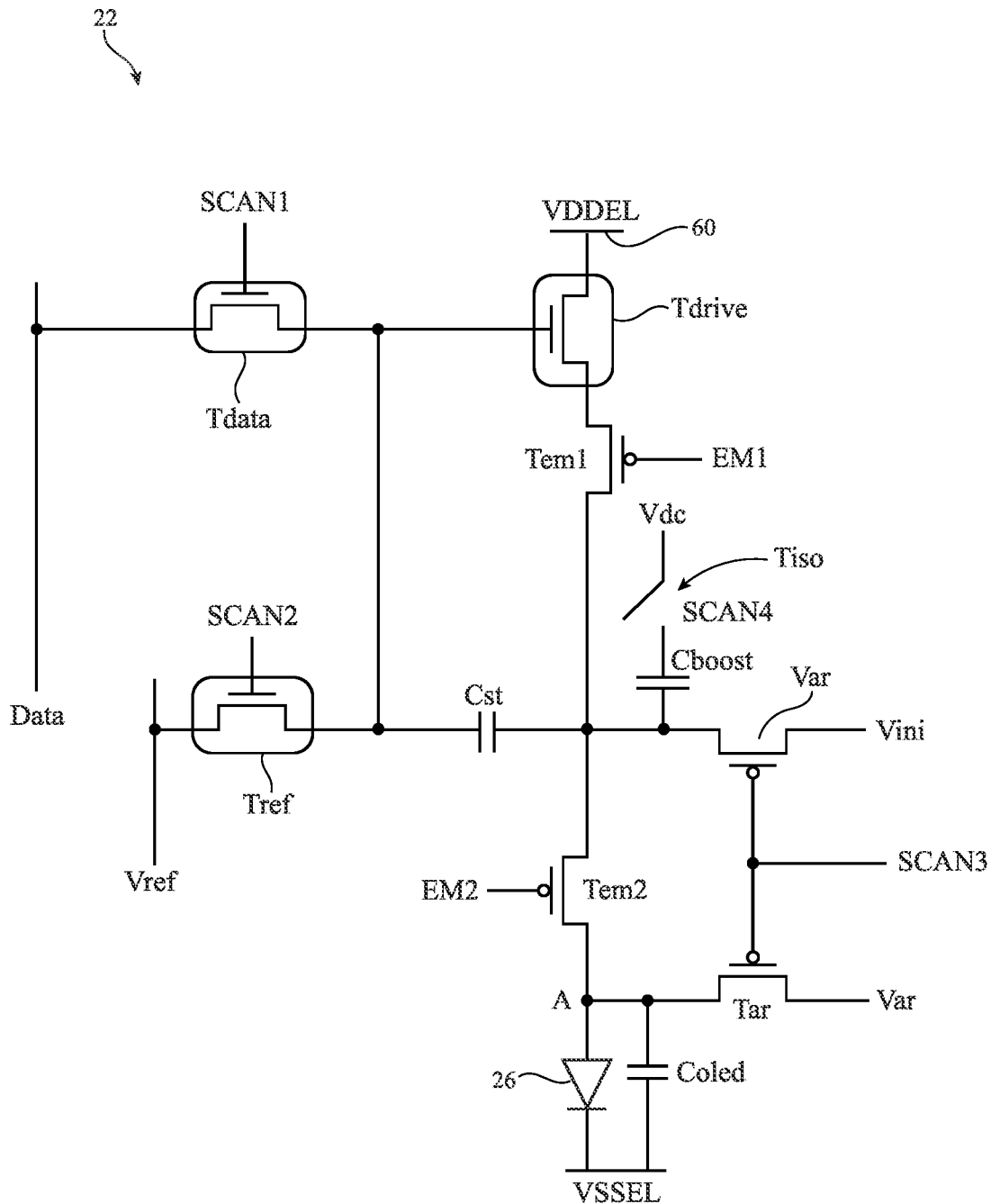
FIG. 10 is a circuit diagram showing another implementation of an illustrative display pixel in accordance with some embodiments.

The example of FIG. 9A in which emission transistor Tem1 is coupled between positive power supply line 60 and drive transistor Tdrive is merely illustrative. FIG. 10 illustrates another suitable embodiment of pixel 22 in which the order of transistors Tdrive and Tem1 are swapped. In particular, transistor Tdrive now has its drain terminal directly coupled to positive power supply line 60 and its source terminal coupled to transistor Tem2 via transistor Tem1. Transistor Tem1 has a source terminal coupled to the source terminal of transistor Tdrive, a gate terminal configured to receive signal EM1, and a drain terminal. Storage capacitor Cst has a first terminal coupled to the gate terminal of transistor Tdrive and a second terminal coupled to the drain terminal of transistor Tem1. Capacitor Cboost is now coupled to the drain terminal of transistor Tem1. The remaining structure of pixel 22 is identical to that already described in connection with FIG. 9A and need not be reiterated in detail to avoid obscuring the present embodiment. The timing diagram for operating the pixel of FIG. 10 may be identical to the timing diagram of FIG. 9B.

Figures 11A, 11B:
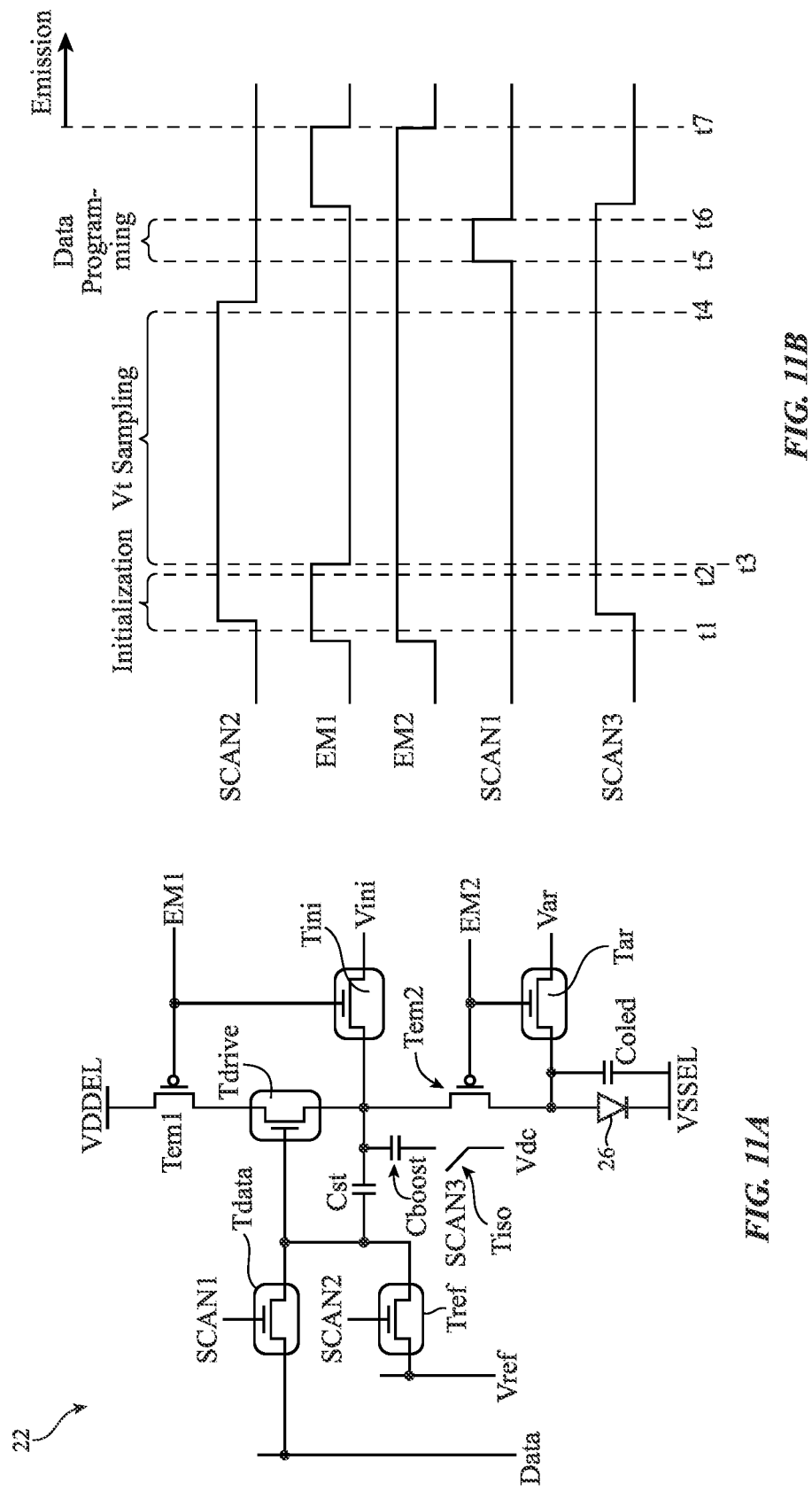
FIG. 11A is a circuit diagram showing another implementation of an illustrative display pixel operable to perform an extended threshold voltage sampling phase separately from a data programming phase in accordance with some embodiments.
FIG. 11B is a timing diagram illustrating the behavior of relevant control waveforms during a refresh operation of the pixel shown in FIG. 11A in accordance with some embodiments.

The embodiment of FIG. 9A in which transistors Tar and Tini are both p-type silicon transistor configured to receive signal SCAN3 is merely illustrative. FIG. 11A illustrates another suitable embodiment of pixel 22 having transistors Tar and Tini both implemented as semiconducting oxide transistors. As shown in FIG. 11A, transistor Tar may have a first source-drain terminal coupled to the anode terminal, a second source-drain terminal configured to receive anode reset voltage Var, and a gate terminal configured to receive emission control signal EM2. Transistor Tem2 is now implemented as a p-type silicon transistor. Transistor Tini may have a first source-drain terminal coupled to the source terminal of transistor Tdrive, a second source-drain terminal configured to receive initialization voltage Vini, and a gate terminal configured to received signal EM1. The remaining structure of pixel 22 is similar to that of FIG. 5A and need not be reiterated in detail to avoid obscuring the present embodiment.

FIG. 11B is a timing diagram illustrating a refresh operation of display pixel 22 of the type shown in FIG. 11A. Prior to time t1, emission control signals EM1 and EM2 can also be driven high to turn off the emission transistors Tem1 and Tem2. Signal EM2 can remain high for the remainder of the refresh operation (e.g., to keep transistor Tem2 off until the start of emission).

During the initialization phase from time t1 to t2, a high EM1 turns on transistor Tini and a high EM2 turns on transistor Tar. Activating anode reset transistor Tar biases the anode terminal of diode 26 to the anode reset voltage level Var. Activating initializing transistor Tini biases the source terminal of transistor Tdrive to the initialization voltage level Vini. Some time after t1, scan signal SCAN2 can be asserted (driven high) to activate (turn on) transistor Tref. Activating transistor Tref drives the gate terminal of transistor Tdrive to the reference voltage level Vref. While at least signal EM1 is asserted, the gate-to-source voltage Vgs of transistor Tdrive will therefore be biased to (Vref−Vini) during the initialization phase. Signal SCAN3 is then driven high sometime during the initialization phase to turn on isolation switch Tiso (e.g., to switch boosting capacitor Cboost into use).

At time t3, first emission control signal EM1 is pulsed low to turn on transistor Tem1. Turning on transistor Tem1 drives the drain terminal of transistor Tdrive up to VDDEL, which will result in the source terminal of transistor Tdrive to charge up to one Vt below the Vref level at the gate of transistor Tdrive. In other words, the source terminal of transistor Tdrive will charge up to (Vref−Vt) during the Vt sampling phase. Thus, the voltage sampled across storage capacitor during this time will be equal to (Vref−[Vref−Vt]), which is equal to Vt. At time t4, signal SCAN2 is driven low to turn off transistor Tref.

At time t5, scan signal SCAN1 is pulsed high to turn on transistor Tdata during the data programming phase. Activating transistor Tdata drives the gate terminal of transistor Tdrive to data voltage Vdata corresponding to a new data signal value for pixel 22. Since transistors Tem2 and Tini are turned off at this time, the source terminal of transistor Tdrive is a high impedance node so capacitor Cst cannot discharge (e.g., the voltage across capacitor Cst will remain equal to Vt even though the drive transistor gate terminal will be driven to a new Vdata level).

At time t7, emission signals EM1 and EM2 are both asserted to begin the emission phase during which diode 26 can emit an amount of light that is proportional to voltage Vdata. During the emission phase, the resulting Vgs of transistor Tdrive will be equal to [Vdata−(Vref−Vt)]. Since the final emission current is proportional to Vgs minus Vt, the emission current will be independent of Vt since (Vgs−Vt) will be equal to (Vdata−Vref+Vt−Vt), where Vt cancels to perform in-pixel threshold voltage compensation. To minimize a display's sensitivity to temperature variations, the Vt sampling phase duration can optionally be extended (e.g., the Vt sampling phase duration can be at least 2 times, 5 times, 2-5 times, 10 times, 5-10 times, 10-20 times, or more than 20 times longer than the data programming phase duration). The duration of the Vt sampling phase can also be dynamically adjusted depending on the degree to which display temperature luminance sensitivity needs to be suppressed.

The example of FIG. 11A in which emission transistor Tem2 is implemented as a p-type silicon transistor and anode reset transistor Tar is implemented as a semiconducting oxide transistor is merely illustrative. FIG. 12A illustrates another suitable embodiment of pixel 22 in which emission transistor Tem2 is implemented as a semiconducting oxide transistor and anode reset transistor Tar is implemented as a p-type silicon transistor. The remaining structure of pixel 22 is identical to that of FIG. 12A and need not be reiterated in detail to avoid obscuring the present embodiment.

FIG. 12B is a timing diagram illustrating a refresh operation of display pixel 22 of the type shown in FIG. 12A. Since signal EM2 that controls transistor Tem2 is now an active-high signal, the polarity of signal EM2 may be inverted relative to that shown in FIG. 11B. Otherwise, the principals and the phases for operating pixel 22 of the type shown in FIG. 12A remain the same as that already described with respect to FIG. 11B and need not be reiterated in detail for the sake of clarity.

Figures 13A, 13B:
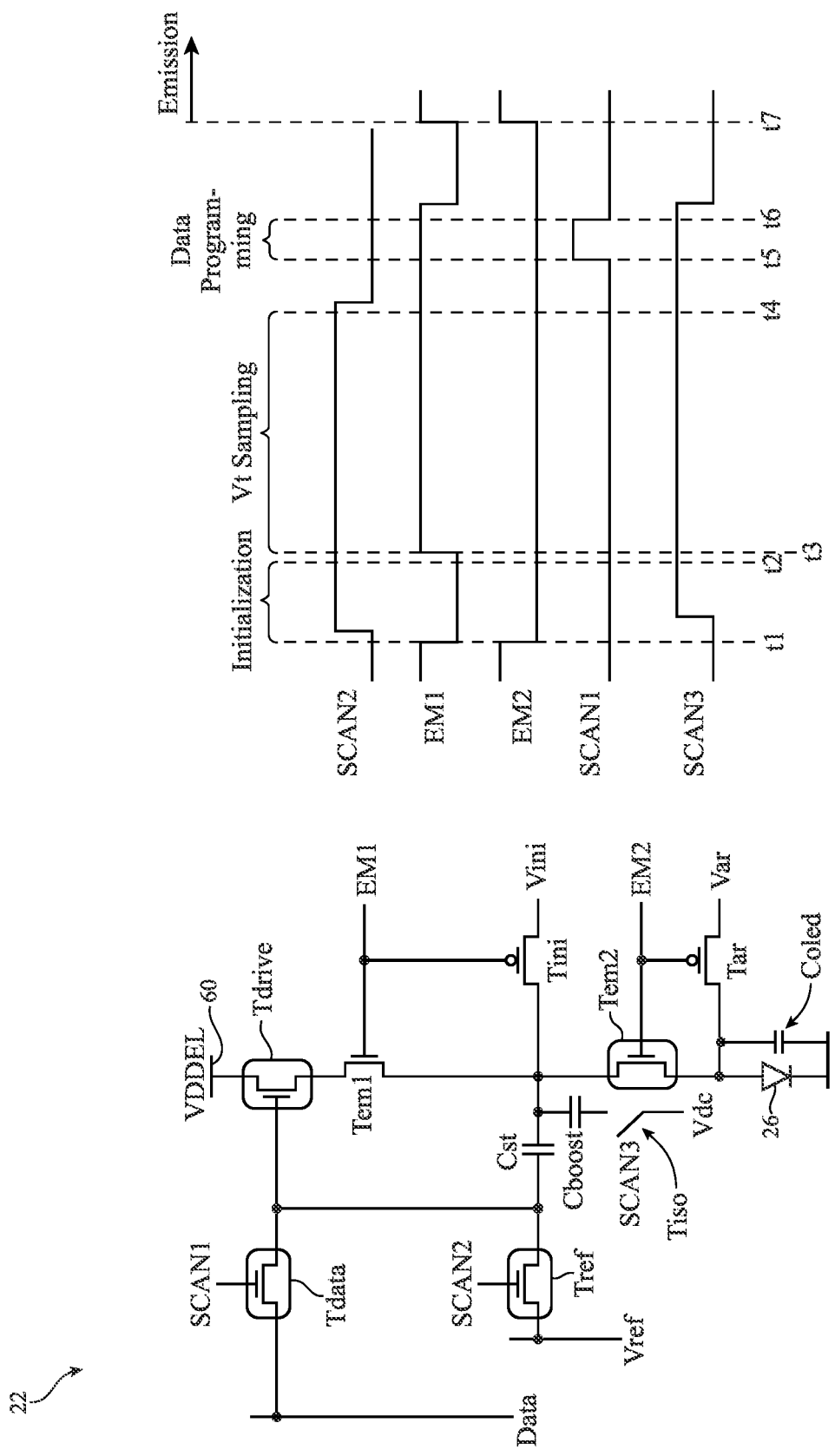
FIG. 13A is a circuit diagram showing another implementation of an illustrative display pixel operable to perform an extended threshold voltage sampling phase separately from a data programming phase in accordance with some embodiments.
FIG. 13B is a timing diagram illustrating the behavior of relevant control waveforms during a refresh operation of the pixel shown in FIG. 13A in accordance with some embodiments.

The example of FIG. 12A in which emission transistor Tem1 is coupled between positive power supply line 60 and drive transistor Tdrive is merely illustrative. FIG. 13A illustrates another suitable embodiment of pixel 22 in which the order of transistors Tdrive and Tem1 are swapped. In particular, transistor Tdrive now has its drain terminal directly coupled to positive power supply line 60 and its source terminal coupled to transistor Tem2 via transistor Tem1. Transistor Tem1 is an n-type silicon transistor having a drain terminal coupled to the source terminal of transistor Tdrive, a gate terminal configured to receive signal EM1, and a source terminal. Storage capacitor Cst has a first terminal coupled to the gate terminal of transistor Tdrive and a second terminal coupled to the source terminal of transistor Tem1. Capacitor Cboost is now coupled to the source terminal of transistor Tem1. Similar to transistor Tar, transistor Tini may also be implemented as a p-type silicon transistor. The remaining structure of pixel 22 is identical to that already described in connection with FIG. 12A and need not be reiterated in detail to avoid obscuring the present embodiment.

FIG. 13B is a timing diagram illustrating a refresh operation of display pixel 22 of the type shown in FIG. 13A. Since signal EM1 that controls transistor Tem1 is now an active-high signal, the polarity of signal EM1 may be inverted relative to that shown in FIG. 12B. Otherwise, the principals and the phases for operating pixel 22 of the type shown in FIG. 13A remain the same as that already described with respect to FIG. 12B and need not be reiterated in detail for the sake of clarity.

Figures 14A, 14B:
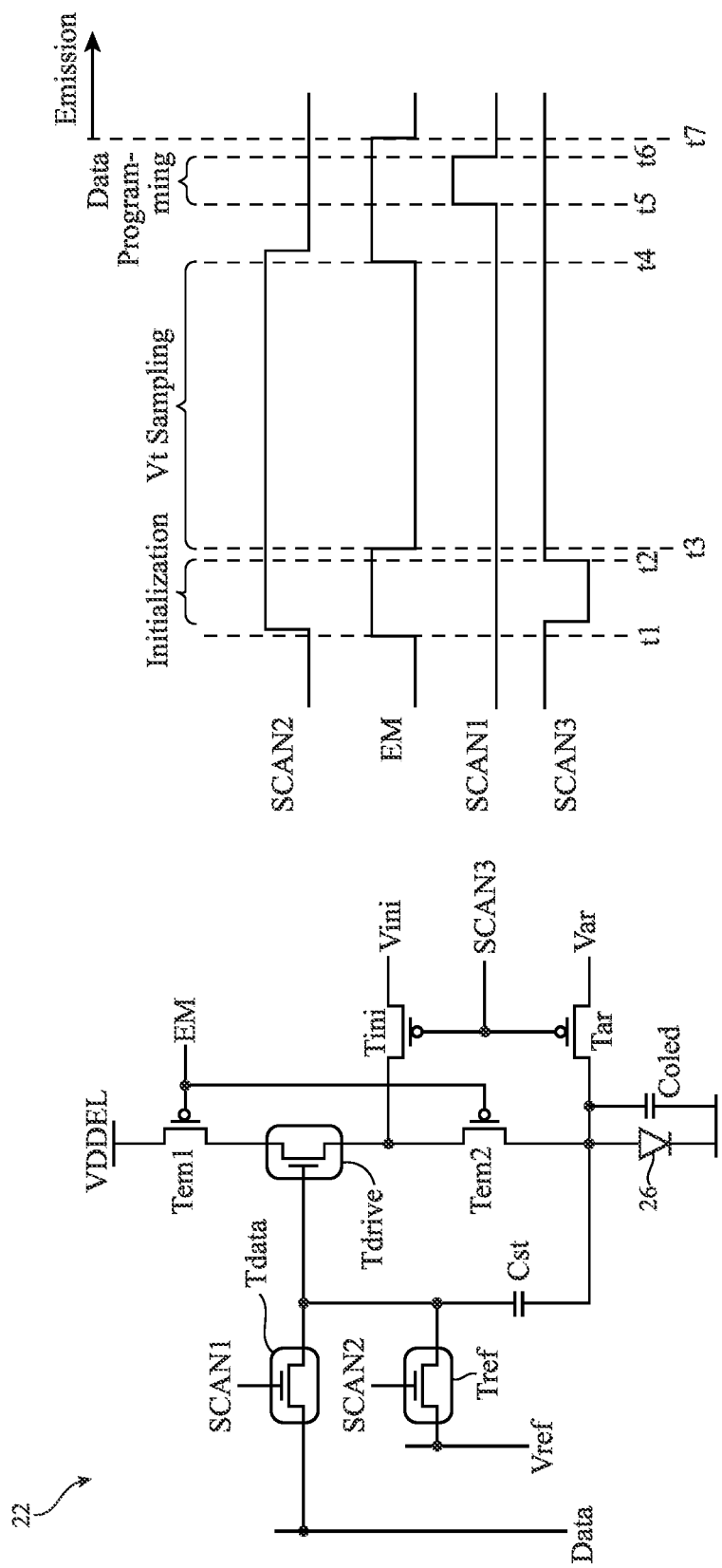
FIG. 14A is a circuit diagram showing another implementation of an illustrative display pixel operable to perform an extended threshold voltage sampling phase separately from a data programming phase in accordance with some embodiments.
FIG. 14B is a timing diagram illustrating the behavior of relevant control waveforms during a refresh operation of the pixel shown in FIG. 14A in accordance with some embodiments.

The embodiment of FIG. 9A in which pixel 22 includes a current-boosting capacitor Cboost is merely illustrative. FIG. 14A illustrates another suitable embodiment of pixel 22 that does not include any current-boosting capacitor. As shown in FIG. 14A, storage capacitor Cst has a first terminal coupled to the gate terminal of transistor Tdrive and a second terminal coupled to the anode terminal of diode 26. Both emission transistors Tem1 and Tem2 are p-type silicon transistors configured to receive the same emission control signal EM. The remaining structure of pixel 22 (except for components Cboost and Tiso) is identical to that already described in connection with FIG. 9A and need not be reiterated in detail to avoid obscuring the present embodiment.

FIG. 14B is a timing diagram illustrating a refresh operation of display pixel 22 of the type shown in FIG. 14A. At time t1, emission control signal EM can also be driven high to turn off the emission transistors Tem1 and Tem2.

Some time after t1, scan signal SCAN2 can be asserted (driven high) to activate (turn on) transistor Tref. Activating transistor Tref drives the gate terminal of transistor Tdrive to the reference voltage level Vref. Signal SCAN3 can then be pulsed low to temporarily activate anode reset transistor Tar and initialization transistor Tini. Activating anode reset transistor Tar biases the anode terminal of diode 26 to the anode reset voltage level Var. Activating initializing transistor Tini biases the source terminal of transistor Tdrive to the initialization voltage level Vini. While signal SCAN3 is asserted, the gate-to-source voltage Vgs of transistor Tdrive will therefore be biased to (Vref−Vini) during the initialization phase.

At time t3, emission control signal EM is pulsed low to turn on transistors Tem1 and Tem2. Turning on transistor Tem1 drives the drain terminal of transistor Tdrive up to VDDEL, which will result in the source terminal of transistor Tdrive to charge up to one Vt below the Vref level at the gate of transistor Tdrive. In other words, the source terminal of transistor Tdrive will charge up to (Vref−Vt) during the Vt sampling phase. Since transistor Tem2 is also turned on, the bottom terminal of Cst will also be charged up to (Vref−Vt). Thus, the voltage sampled across storage capacitor during this time will be equal to (Vref−[Vref−Vt]), which is equal to Vt. At time t4, emission signal EM is driven high to turn off transistor Tem1 and signal SCAN2 is driven low to turn off transistor Tref.

At time t5, scan signal SCAN1 is pulsed high to turn on transistor Tdata during the data programming phase. Activating transistor Tdata drives the gate terminal of transistor Tdrive to data voltage Vdata corresponding to a new data signal value for pixel 22. Since transistors Tem2 and Tar are turned off at this time, the anode terminal is a high impedance node so capacitor Cst cannot discharge (e.g., the voltage across capacitor Cst will remain equal to Vt even though the drive transistor gate terminal will be driven to a new Vdata level).

At time t7, emission signal EM is asserted to begin the emission phase during which diode 26 can emit an amount of light that is proportional to voltage Vdata. During the emission phase, the resulting Vgs of transistor Tdrive will be equal to [Vdata−(Vref−Vt)]. Since the final emission current is proportional to Vgs minus Vt, the emission current will be independent of Vt since (Vgs−Vt) will be equal to (Vdata−Vref+Vt−Vt), where Vt cancels to perform in-pixel threshold voltage compensation. To minimize a display's sensitivity to temperature variations, the Vt sampling phase duration can optionally be extended (e.g., the Vt sampling phase duration can be at least 2 times, 5 times, 2-5 times, 10 times, 5-10 times, 10-20 times, or more than 20 times longer than the data programming phase duration). The duration of the Vt sampling phase can also be dynamically adjusted depending on the degree to which display temperature luminance sensitivity needs to be suppressed.

Figure 15:
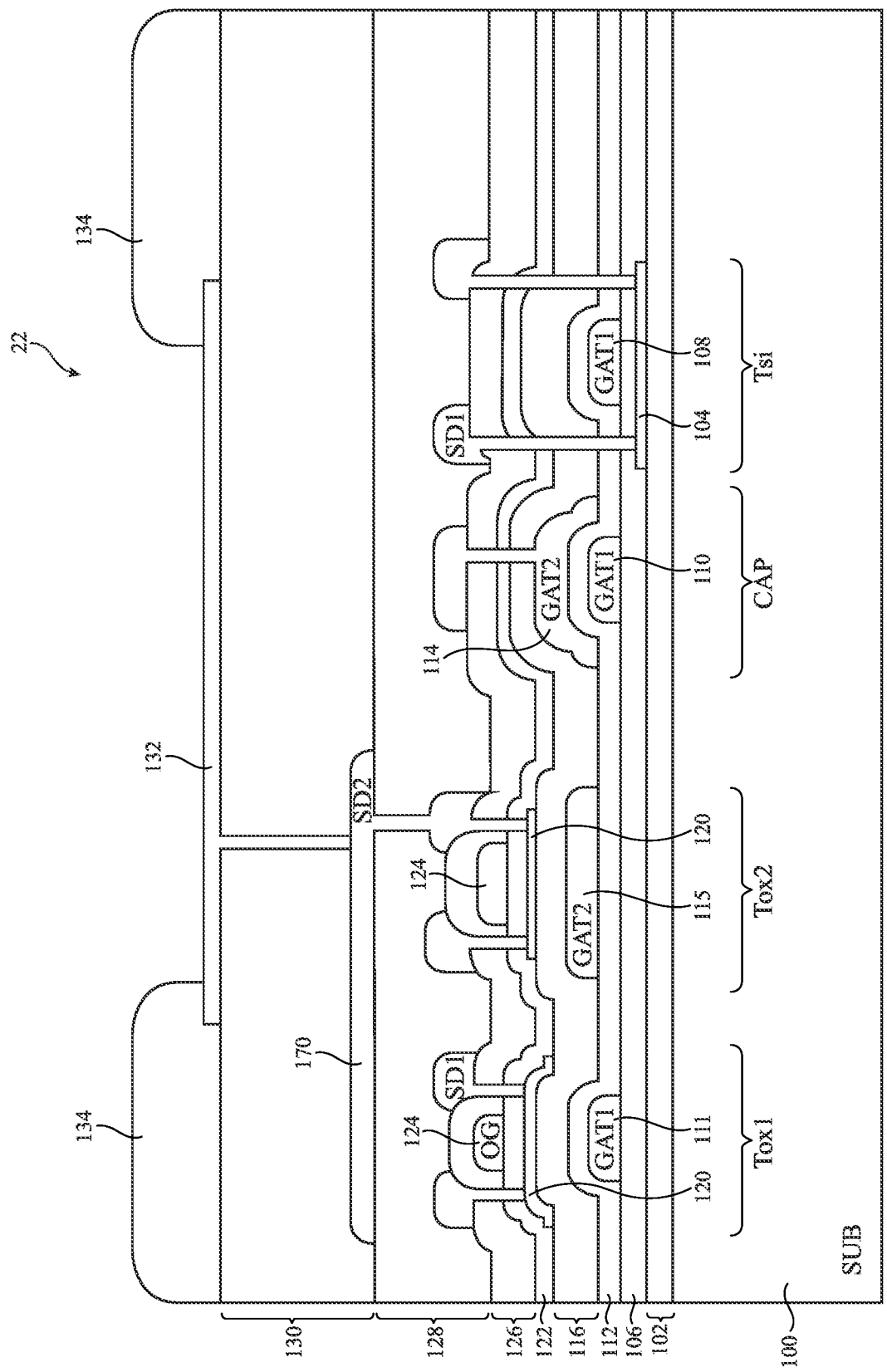
FIG. 15 is a cross-sectional side view of an illustrative display pixel having silicon transistor and semiconducting-oxide transistors in accordance with some embodiments.

FIG. 15 is a cross-sectional side view of an illustrative display pixel 22 (e.g., pixel 22 of the type shown in FIG. 5A, 6A, 7A, 8A, 9A, 10, 11A, 12A, 13A, or 14A). As shown in FIG. 15, the display may include thin-film transistor (TFT) layers having a substrate layer such as substrate 100. Substrate 100 may optionally be covered with one or more buffer layers 102. Buffer layer(s) 102 may include inorganic buffer layers such as layers of silicon oxide, silicon nitride, or other passivation or dielectric material.

A polysilicon layer (e.g., a low temperature polysilicon or "LTPS" layer) may be formed on inorganic buffer layer 102. Polysilicon layer 104 may be patterned and etched to form an LTPS or silicon trace 104. The two opposing ends of silicon trace 104 may optionally be doped (e.g., n-doped or p-doped) to form source-drain regions of a silicon transistor Tsi (e.g., an LTPS transistor) within display pixel 22.

A gate insulating (GI) layer 106 may be formed on buffer layer 102 and over silicon trace 104. As an example, the gate insulating layer 106 may be formed from silicon oxide, silicon nitride, silicon oxynitride, tantalum oxide, cerium oxide, carbon-doped oxide, aluminum oxide, hafnium oxide, titanium oxide, vanadium oxide, spin-on organic polymeric dielectrics, spin-on silicon based polymeric dielectric, a combination of these materials, and other suitable low-k or high-k solid insulating material.

A first metal layer (e.g., a first gate metal layer GAT1) may be formed over gate insulator layer 106. The GAT1 metal layer may be formed using aluminum, nickel, chromium, copper, molybdenum, titanium, silver, gold, a combination of these materials, other metals, or other suitable gate conductors. The GAT1 metal layer may be patterned and etched to form a gate conductor 108 for silicon transistor Tsi. The GAT1 metal layer may also be patterned and etched to form a terminal of one or more capacitor inside pixel 22 (see, e.g., conductive plate 110 formed from the GAT1 metal layer configured as a lower terminal of capacitor CAP). Capacitor CAP may represent storage capacitor Cst, current-boosting capacitor Cboost, or any other capacitor within pixel 22. The GAT1 metal layer may also be patterned and etched to form a bottom gate and/or shielding layer for a semiconducting oxide transistor such as semiconducting oxide transistor Tox1 within pixel 22 (see, e.g., metal layer 111 configured as the bottom gate/shielding layer for transistor Tox1).

In general, display pixel 22 may include any suitable number of silicon transistors (if any). Thus, the cross-section of FIG. 15 in which pixel 22 is shown to have only one silicon transistor Tsi is merely illustrative. Transistor Tsi may represent any one or more silicon transistors within pixel 22. In some embodiments, pixel 22 may be provided with at least two silicon transistors. As another example, pixel 22 may be provided with three or more silicon transistors. As another example, pixel 22 may include four to ten silicon transistors. As yet another example, pixel 22 may include more than 10 silicon transistors.

An interlayer dielectric (ILD) layer 112 may be formed over the first gate metal layer and silicon transistor Tsi. ILD layer 112 may be formed from silicon oxide, silicon nitride, silicon oxynitride, tantalum oxide, cerium oxide, carbon-doped oxide, aluminum oxide, hafnium oxide, titanium oxide, vanadium oxide, spin-on organic polymeric dielectrics, spin-on silicon based polymeric dielectric, a combination of these materials, and other suitable low-k or high-k solid insulating material.

A second metal layer (e.g., a second gate metal layer GAT2) may be formed on the ILD layer 112. The GAT2 metal layer may be formed using similar or different materials as the GAT1 metal layer. The GAT2 metal layer may be patterned and etched to form another terminal of one or more capacitor inside pixel 22 (see, e.g., conductive plate 114 formed from the GAT2 metal layer configured as an upper terminal of capacitor CAP). In some embodiments, a bottom shielding layer such as GAT2 metal shielding layer 115 may be formed directly under a semiconducting oxide transistor such as semiconducting oxide transistor Tox2. Configured in this way, the GAT2 metal layer 115 may be configured as a bottom gate and/or shielding layer for transistor Tox2.

An semiconductor oxide buffer layer 116 may be formed over the second GAT2 metal layer. Buffer layer 116 may be formed using similar or different materials as the ILD layer 112 or buffer layers 102. Buffer layer 16 may be an inorganic buffer layer such a silicon oxide layer, silicon nitride layer, etc.

A semiconducting oxide layer (e.g., an indium gallium zinc oxide or "IGZO" layer) may be formed over buffer layer 116. The semiconducting-oxide layer may be patterned and etched to form semiconducting-oxide traces 120. The two opposing ends of each semiconducting-oxide trace 120 may optionally be doped (e.g., n-doped or p-doped) to form source-drain regions of semiconducting oxide transistors such as transistors Tox1 and Tox2 within display pixel 22. Transistor Tox1 may represent any semiconducting oxide transistor within pixel 22. Transistor Tox2 may represent the drive transistor or any other semiconducting oxide transistor within pixel 22.

An insulation layer such as gate insulator layer 122 may be formed on patterned semiconducting-oxide traces 120. Layer 122 may be formed from silicon oxide, silicon nitride, silicon oxynitride, tantalum oxide, cerium oxide, carbon-doped oxide, aluminum oxide, hafnium oxide, titanium oxide, vanadium oxide, spin-on organic polymeric dielectrics, spin-on silicon based polymeric dielectric, a combination of these materials, and other suitable low-k or high-k solid insulating material.

A third gate metal layer OG may be formed on gate insulating layer 122. Third gate metal layer OG may be configured to serve as gate conductors 124 for semiconducting oxide transistors Tox1 and Tox2. The third gate metal layer may therefore sometimes be referred to as the oxide gate conductor or semiconducting oxide gate conductor. The example of FIG. 15 in which gate insulating layer 122 is formed as a blanket layer across the surface of oxide buffer layer 116 is merely illustrative. In other embodiments, gate insulating layer 122 may only be formed underneath the oxide gate conductor. Another interlayer dielectric layer 126 may be formed on layer 12 and over the semiconducting oxide transistors.

In general, display pixel 22 may include any suitable number of semiconducting oxide transistors (if any). Thus, the cross-section of FIG. 15 in which pixel 22 is shown to include only two semiconducting oxide transistors Tox1 and Tox2 is merely illustrative. As another example, pixel 22 may be provided with three or more semiconducting-oxide transistors. As another example, pixel 22 may include four to six semiconducting-oxide transistors. As another example, pixel 22 may include less than three semiconducting-oxide transistors. As another example, pixel 22 may include less than four semiconducting-oxide transistors. As another example, pixel 22 may include less than five semiconducting-oxide transistors. As yet another example, pixel 22 may include more than five semiconducting-oxide transistors. If desired, pixel 22 may include only semiconducting-oxide thin-film transistors.

A first source-drain metal routing layer SD1 may be formed on dielectric layer 126. The SD1 metal routing layer may be formed from aluminum, nickel, chromium, copper, molybdenum, titanium, silver, gold, a combination of these materials, other metals, or other suitable metal routing conductors. The SD1 metal routing layer may be patterned and/or etch to form SD1 metal routing paths. As shown in FIG. 15, some of the SD1 metal routing paths may be coupled using vertical via(s) to one or more source-drain region associated with silicon transistor Tsi. Some of the SD1 metal routing paths may be coupled to one or more source-drain region associated with semiconducting oxide transistors Tox1 and Tox2 using corresponding vertical via(s) formed through layers 122 and 126. Some of the SD1 metal routing paths may be coupled using vertical via(s) to a GAT2 metal conductor. If desired, some of the SD1 metal routing paths may be coupled using vertical via(s) to an oxide gate (OG) conductor.

A first planarization (PLN1) layer such as layer 128 may be formed over the SD1 metal routing layer. Planarization layer 128 may be formed from organic dielectric materials such as polymer. A second source-drain metal routing layer SD2 may be formed on organic planarization layer 128. The SD2 metal routing layer may be formed using the same, similar, or different materials than the SD1 metal routing layer. The SD2 metal routing layer may be patterned and/or etch to form SD2 metal routing paths. Some of the SD2 metal routing paths may be selectively coupled to some of the SD1 metal routing paths using vertical via(s) formed through first planarization layer 128. In some embodiments, a metal shielding layer such as metal shielding layer 170 may be formed at least partially over and covering transistors Tox1 and Tox2 (e.g., metal shield 170 may directly overlap and cover at least a portion of transistors Tox1 and Tox2). If desired, metal shielding layer 170 may completely cover transistors Tox1 and Tox2 (e.g., metal shielding layer 170 may have peripheral edges extending past the source-drain regions of the semiconducting-oxide transistors). Metal shielding layer 170 may be formed in the SD2 metal routing layer (as an example). Metal shielding layer 170 may be biased to positive power supply voltage VDD, ground power supply voltage VSS, or other static voltage levels. Configured in this way, layer 170 may shield transistor Tox1 and/or Tox2 from undesired sources of noise or parasitic coupling originating from components above the semiconducting oxide transistors.

A second planarization (PLN2) layer such as layer 130 may be formed on planarization layer 128 and over the SD2 routing metal lines. Planarization layer 130 may also be formed from organic dielectric materials such as a polymer. An anode layer including an anode conductor 132 forming the anode terminal of the organic light-emitting diode within pixel 22 may be formed on planarization layer 130. Anode conductor 132 may be coupled to at least some of the SD2 metal routing paths using vertical via(s) 192 formed through planarization layer 130. A pixel definition layer 134 can be formed over the anode layer 132 to define an opening for each pixel 22. Additional structures may be formed over the anode layer. For example, a spacer structure, organic light-emitting diode emissive material, a cathode layer, and other pixel structures may also be included in the stackup of display pixel 22. However, these additional structures are omitted for the sake of clarity and brevity.

The foregoing is merely illustrative and various modifications can be made to the described embodiments. The foregoing embodiments may be implemented individually or in any combination.

What is claimed is:

1. A display pixel comprising:
    a drive transistor having a drain terminal, a gate terminal, and a source terminal;
    a light-emitting diode having an anode terminal coupled to the source terminal of the drive transistor;
    a first capacitor having a first terminal coupled to the gate terminal of the drive transistor and having a second terminal coupled to the source terminal of the drive transistor;
    a second capacitor having a first terminal coupled to the source terminal of the drive transistor and having a second terminal coupled to a static voltage line;
    a data loading transistor having a first source-drain terminal coupled to the gate terminal of the drive transistor, a second source-drain terminal coupled to a data line, and a gate terminal configured to receive a first scan signal that is asserted during a data programming phase; and
    a noise isolation transistor coupled in series with the second capacitor between the static voltage line and the source terminal of the drive transistor, wherein the noise isolation transistor is activated during the data programming phase.

2. The display pixel of claim 1, wherein the static voltage line comprises a power supply line.

3. The display pixel of claim 1, further comprising:
a gate voltage setting transistor having a first source-drain terminal coupled to the gate terminal of the drive transistor, a second source-drain terminal coupled to a reference voltage line, and a gate terminal configured to receive a second scan signal different than the first scan signal.

4. The display pixel of claim 3, wherein the drive transistor, the data loading transistor, and the gate voltage setting transistor comprise semiconducting oxide transistors having semiconducting oxide material.

5. The display pixel of claim 3, further comprising:
a first emission transistor coupled in series with the drive transistor and configured to receive a first emission control signal;
a second emission transistor coupled in series with the drive transistor and configured to receive a second emission control signal different than the first emission control signal; and
an anode reset transistor having a first source-drain terminal coupled to the anode terminal of the light-emitting diode, a second source-drain terminal configured to receive an anode reset voltage, and a gate terminal configured to receive the first emission control signal.

6. The display pixel of claim 5, wherein:
the first emission transistor comprises a p-type silicon transistor;
the second emission transistor comprises an n-type silicon transistor; and
the anode reset transistor comprises a semiconducting oxide transistor.

7. The display pixel of claim 5, wherein:
the first emission transistor comprises a semiconducting oxide transistor;
the second emission transistor comprises a p-type silicon transistor; and
the anode reset transistor comprises a p-type silicon transistor.

8. The display pixel of claim 5, wherein:
the first emission transistor comprises a semiconducting oxide transistor;
the second emission transistor comprises a p-type silicon transistor; and
the anode reset transistor comprises a semiconducting oxide transistor.

9. The display pixel of claim 5, wherein the first emission transistor is coupled between the drive transistor and the second emission transistor.

10. The display pixel of claim 3, further comprising:
a first emission transistor coupled in series with the drive transistor and configured to receive a first emission control signal;
a second emission transistor coupled in series with the drive transistor and configured to receive a second emission control signal different than the first emission control signal;
an anode reset transistor having a first source-drain terminal coupled to the anode terminal of the light-emitting diode, a second source-drain terminal configured to receive an anode reset voltage, and a gate terminal configured to receive a third scan signal different than the first and second scan signals; and
an initialization transistor having a first source-drain terminal coupled to the source terminal of the drive transistor, a second source-drain terminal configured to receive an initialization voltage, and a gate terminal configured to receive the third scan signal.

11. The display pixel of claim 10, wherein the first emission transistor, the second emission transistor, the anode reset transistor, and the initialization transistor comprise p-type silicon transistors.

12. The display pixel of claim 11, wherein the first emission transistor is coupled between the drive transistor and the second emission transistor.

13. The display pixel of claim 3, further comprising:
a first emission transistor coupled in series with the drive transistor and configured to receive a first emission control signal;
a second emission transistor coupled in series with the drive transistor and configured to receive a second emission control signal different than the first emission control signal;
an anode reset transistor having a first source-drain terminal coupled to the anode terminal of the light-emitting diode, a second source-drain terminal configured to receive an anode reset voltage, and a gate terminal configured to receive the second emission control signal; and
an initialization transistor having a first source-drain terminal coupled to the source terminal of the drive transistor, a second source-drain terminal configured to receive an initialization voltage, and a gate terminal configured to receive the first emission control signal.

14. The display pixel of claim 3, further comprising:
a first emission transistor coupled in series with the drive transistor and configured to receive a first emission control signal;
a second emission transistor coupled in series with the drive transistor and configured to receive a second emission control signal different than the first emission control signal; and
an anode reset transistor having a first source-drain terminal coupled to the anode terminal of the light-emitting diode, a second source-drain terminal configured to receive an anode reset voltage, and a gate terminal configured to receive a third scan signal different than the first and second scan signals, wherein the noise isolation transistor has a gate terminal configured to receive the third scan signal.

15. The display pixel of claim 14, wherein the drive transistor, the noise isolation transistor, the data loading transistor, the gate voltage setting transistor, the first emission transistor, the second emission transistor, and the anode reset transistor are all semiconducting oxide transistors.

16. A method of operating a display pixel having a drive transistor, a light emitting diode coupled in series with the drive transistor, a data loading transistor, and an isolation transistor, the method comprising:
during an emission phase, decoupling the source terminal of the drive transistor from a static voltage source in the display pixel, by deactivating the isolation transistor, to prevent noise from the cathode terminal of the light-emitting diode from coupling onto the static voltage source;
during an initialization phase, applying a reference voltage to the gate terminal of the drive transistor;
during the initialization phase, resetting the anode terminal of the light-emitting diode;
during a threshold voltage sampling phase, biasing a storage capacitor coupled to the gate terminal of the drive transistor such that a voltage across the storage capacitor is proportional to a threshold voltage of the drive transistor; and during a data programming phase, loading a data signal onto the gate terminal of the drive transistor, by activating the data loading transistor, while coupling the source terminal of the drive transistor to the static voltage source, by activating the noise isolation transistor.

17. The method of claim 16, wherein the display pixel further comprises a current boosting capacitor coupled in series with the noise isolation transistor between the source terminal of the drive transistor and the static voltage source.

18. The method of claim 17, further comprising:
activating the isolation transistor during the initialization phase, the threshold voltage sampling phase, and the data programming phase.

19. The method of claim 16, wherein the data programming phase has a first duration and wherein the threshold voltage sampling phase has a second duration that is at least five times the first duration.

20. The method of claim 16, further comprising:
asserting an emission control signal during the emission phase; and
using the emission control signal to activate an anode reset transistor to reset the anode terminal of the light-emitting diode during the initialization phase.

21. A display pixel comprising:
a light-emitting diode having an anode and a cathode;
a drive transistor having a first source-drain terminal coupled to a power supply line, a second source-drain terminal coupled to the anode, and a gate terminal;
a storage capacitor having a first terminal coupled to the gate terminal of the drive transistor and having a second terminal coupled to the second source-drain terminal of the drive transistor;
a data loading transistor having a first source-drain terminal coupled to the gate terminal of the drive transistor, a second source-drain terminal coupled to a data line, and a gate terminal configured to receive a first scan signal;
a voltage setting transistor having a first source-drain terminal coupled to the gate terminal of the drive transistor, a second source-drain terminal coupled to a reference voltage line, and a gate terminal configured to receive a second scan signal;
a current boosting capacitor configured to boost an amount of current that the drive transistor drives through the light-emitting diode during an emission phase, the current boosting capacitor having a first terminal coupled to the second source-drain terminal of the drive transistor and having a second terminal coupled to the power supply line; and
an isolation switch having a first terminal coupled to the power supply line and having a second terminal coupled to the second terminal of the current boosting capacitor without being directly coupled to the drive transistor, the isolation switch being disabled during the emission phase to prevent noise on the cathode from coupling to the power supply line.

22. The display pixel of claim 21, further comprising:
an emission transistor coupled in series with the drive transistor and the light-emitting diode; and
a reset transistor coupled to the anode, wherein the emission transistor and the reset transistor are configured to receive a same control signal.

23. The display pixel of claim 21, further comprising:
first and second emission transistors coupled in series with the drive transistor and the light-emitting diode; and
an anode reset transistor having a first source-drain terminal coupled to the anode, a second source-drain terminal configured to reset an anode reset voltage, and a gate terminal configured to receive a third scan signal, the isolation switch having a gate terminal that also receives the third scan signal.

\* \* \* \* \*